(12) United States Patent
Yashiro et al.

(10) Patent No.: US 9,863,991 B2
(45) Date of Patent: Jan. 9, 2018

(54) INSPECTION DEVICE

(71) Applicant: Sharp Kabushiki Kaisha, Osaka (JP)

(72) Inventors: Yuhji Yashiro, Osaka (JP); Kazuya Yoshimura, Osaka (JP); Shinji Matsumoto, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 51 days.

(21) Appl. No.: 14/899,995

(22) PCT Filed: Feb. 26, 2014

(86) PCT No.: PCT/JP2014/054694
§ 371 (c)(1),
(2) Date: Dec. 18, 2015

(87) PCT Pub. No.: WO2014/208126
PCT Pub. Date: Dec. 31, 2014

(65) Prior Publication Data
US 2016/0139191 A1    May 19, 2016

(30) Foreign Application Priority Data

Jun. 28, 2013  (JP) ................................ 2013-137256

(51) Int. Cl.
*G01R 31/02* (2006.01)
*G06F 3/044* (2006.01)
*G01R 31/28* (2006.01)

(52) U.S. Cl.
CPC ............. *G01R 31/02* (2013.01); *G06F 3/044* (2013.01); *G01R 31/2829* (2013.01)

(58) Field of Classification Search
CPC ............ G01R 31/2834; G01R 31/2887; G01R 1/0483; G01R 1/06794; G01R 31/2601;
(Continued)

(56) References Cited

U.S. PATENT DOCUMENTS

| 4,870,356 A | * | 9/1989 | Tingley ................ G01R 1/0735 324/72.5 |
| 2012/0134549 A1 | * | 5/2012 | Benkley, III ........... G01N 27/04 382/124 |

(Continued)

FOREIGN PATENT DOCUMENTS

| JP | 2010-86026 A | | 4/2010 |
| JP | 2016086026 A | * | 4/2010 |

*Primary Examiner* — Tung X Nguyen
*Assistant Examiner* — Robert P Alejnikov, Jr.
(74) *Attorney, Agent, or Firm* — Chen Yoshimura LLP

(57) ABSTRACT

A method of inspecting a sensor sheet formed by a roll-to-roll scheme for a touch sensor, the sensor sheet including a roll sheet and a sensor electrode layer thereon, the sensor electrode layer including sensor electrodes running in a prescribed direction, the sensor sheet further including a terminal connected to the sensor electrode layer and alignment marks, the method including: arranging the sensor sheet on an inspection table of an inspection device, the inspection table having an alignment mark and inspection electrodes running in another prescribed direction such that at least one of the alignment marks aligns with the alignment mark on the inspection table and such that the inspection electrodes face the sensor electrodes orthogonally in a plan view and are vertically separated by a dielectric to form capacitances at respective intersections therebetween; measuring the capacitances at the respective intersections; and outputting the measured capacitances as an inspection result.

8 Claims, 28 Drawing Sheets

(58) Field of Classification Search
CPC ............ G01R 31/2893; G01R 1/07307; G01R 1/07385; G01R 1/36; G01R 3/00; G01R 31/2889; G01R 31/2827; G01R 31/2891; G01F 3/044; G01F 2001/136254; G02F 1/1309; G02F 1/136259; G02F 2001/136263; G02F 2001/136268
USPC .......................... 324/750.16, 750.23, 754.07
See application file for complete search history.

(56) References Cited

U.S. PATENT DOCUMENTS

| 2012/0242938 A1* | 9/2012 | Chen | ....................... | G02F 1/133 |
| | | | | 349/106 |
| 2013/0049769 A1* | 2/2013 | Grimm | ............... | G01M 5/0033 |
| | | | | 324/649 |

\* cited by examiner

FIG. 3
(a)
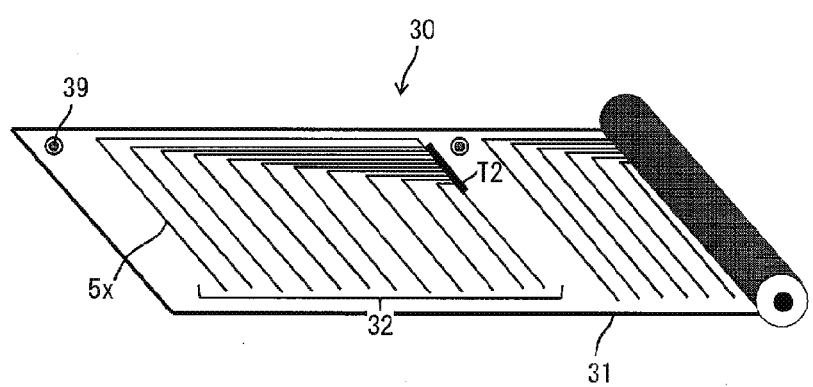
(b)
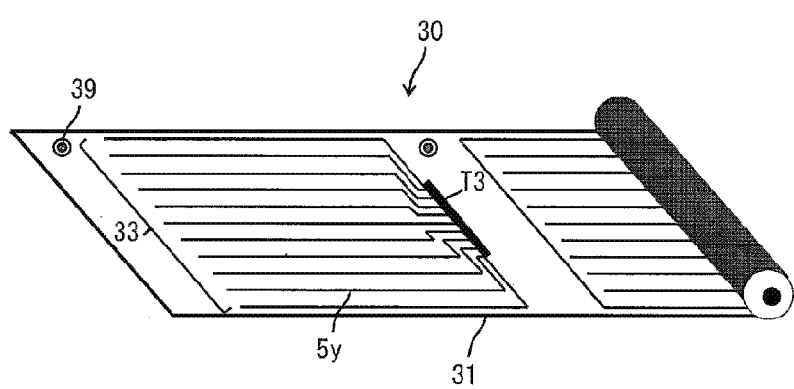

FIG. 7
(a)
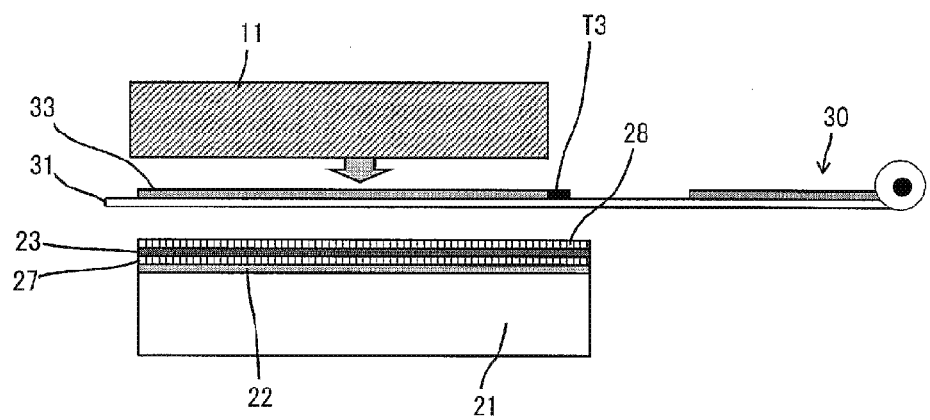
(b)
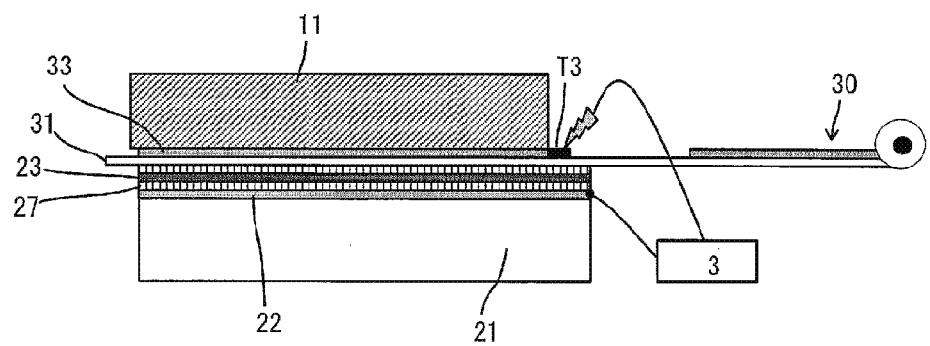

FIG. 10
(a)
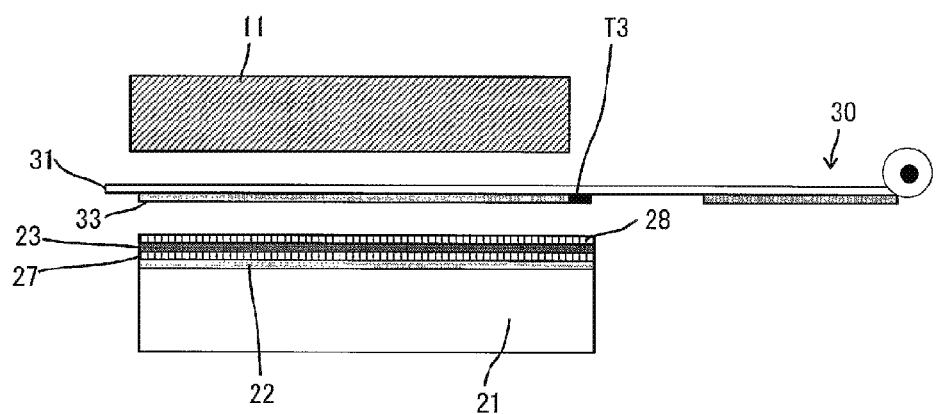
(b)
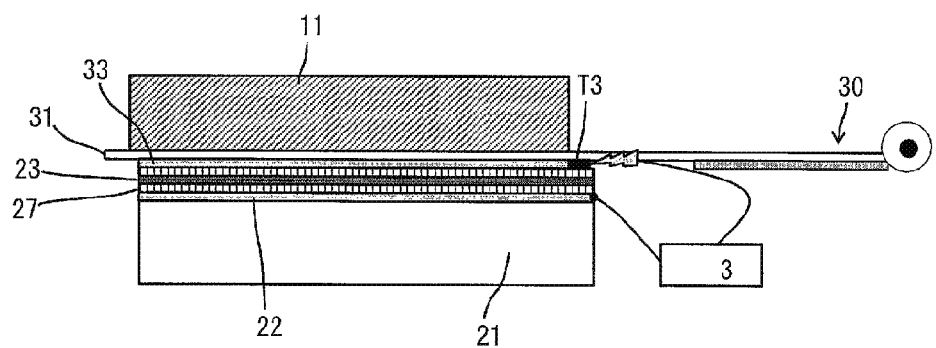

FIG. 12
(a)
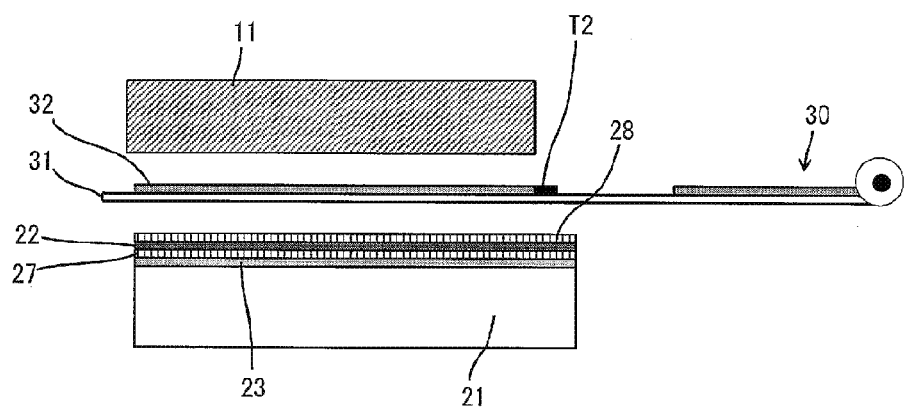
(b)
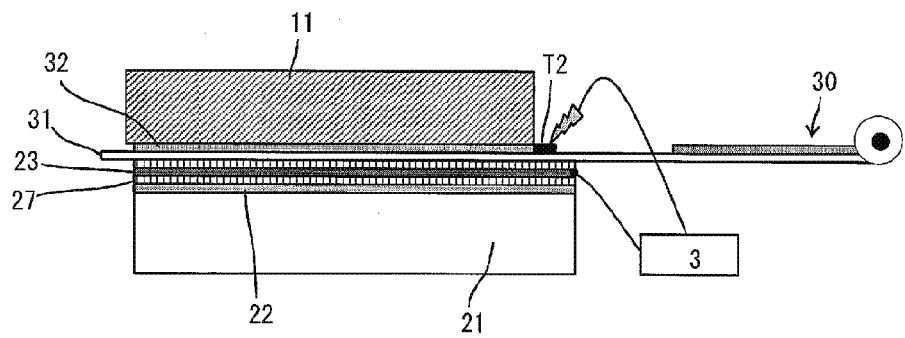

FIG. 14
(a)
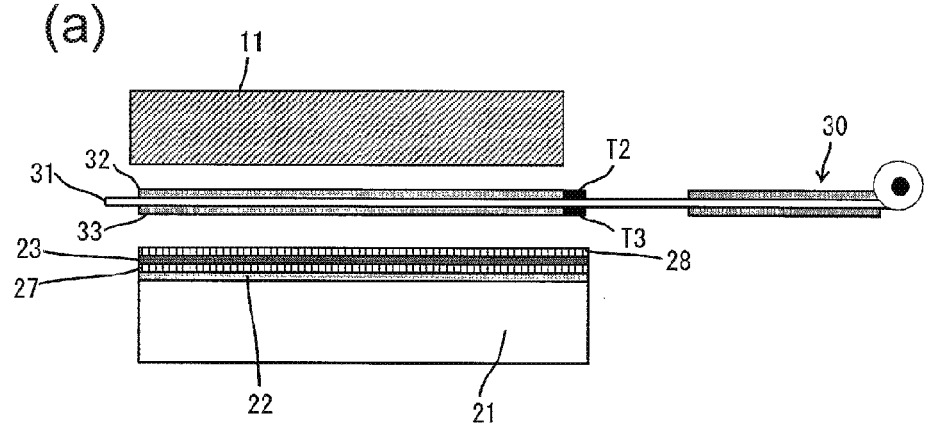
(b)
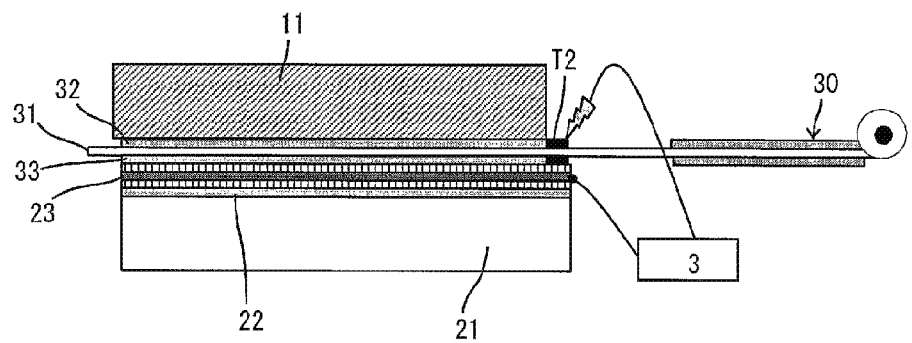
(c)
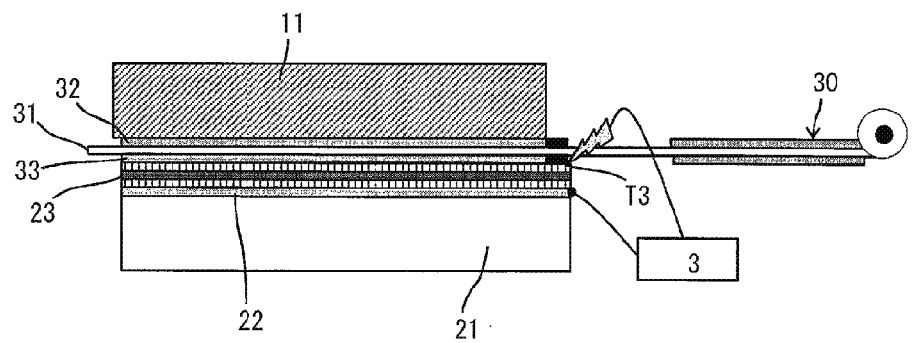

FIG. 16
(a)
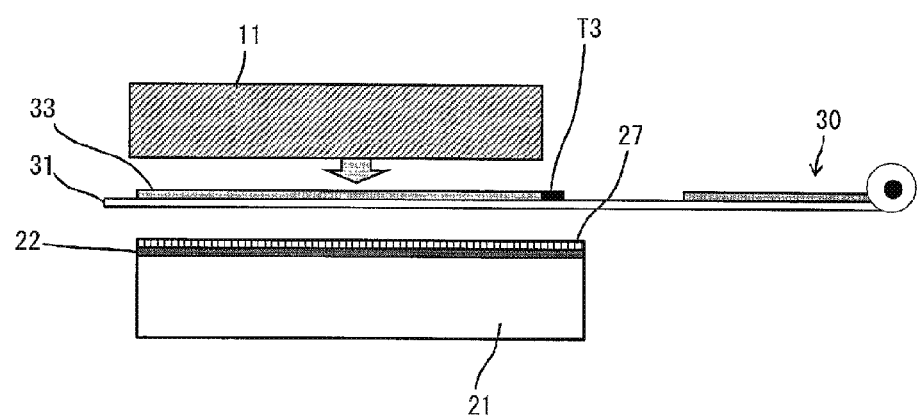
(b)
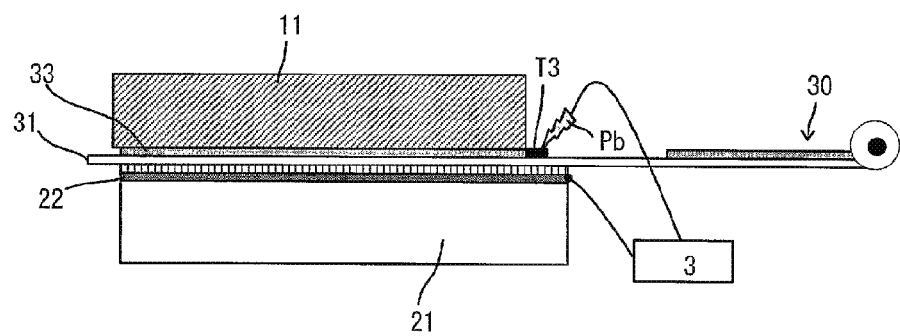

FIG. 18
(a)
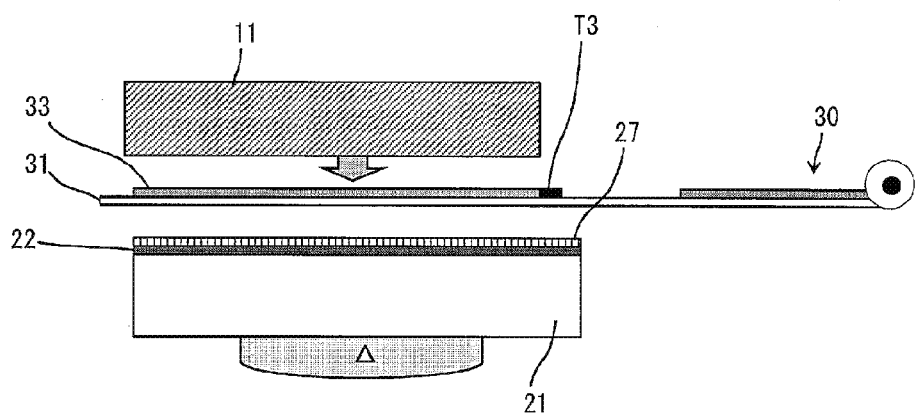
(b)
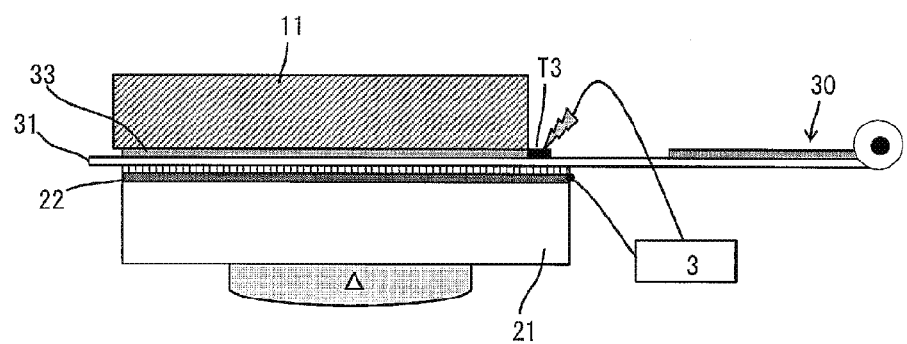

FIG. 19
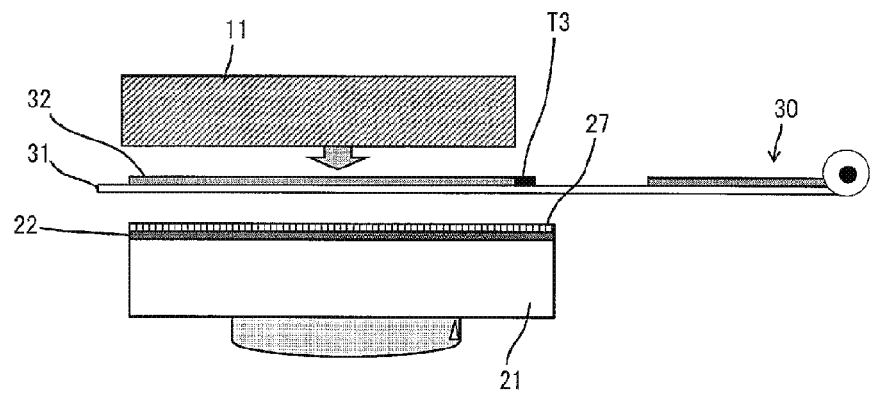
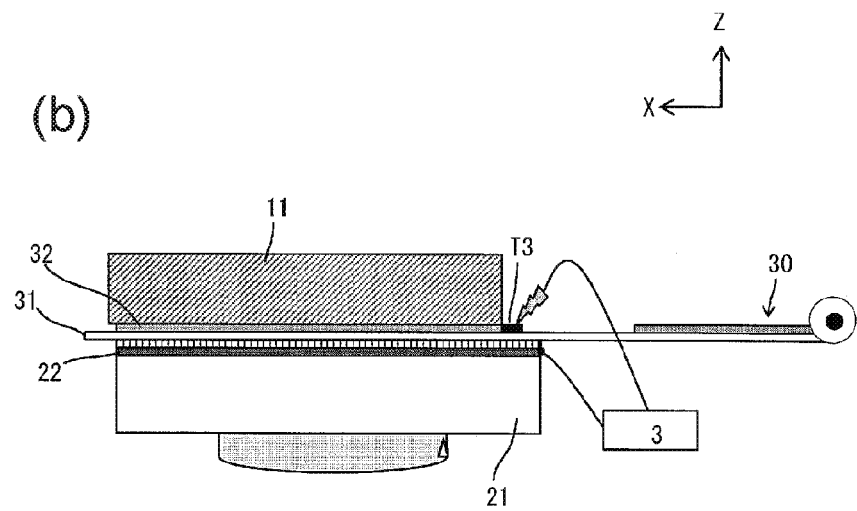

FIG. 20
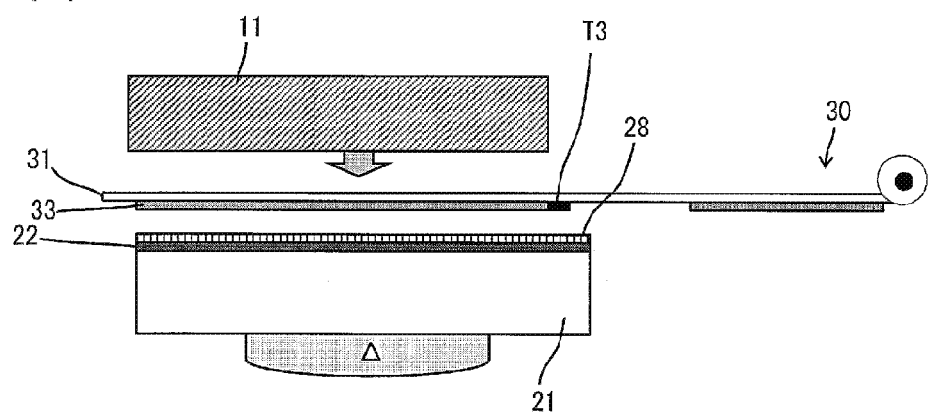
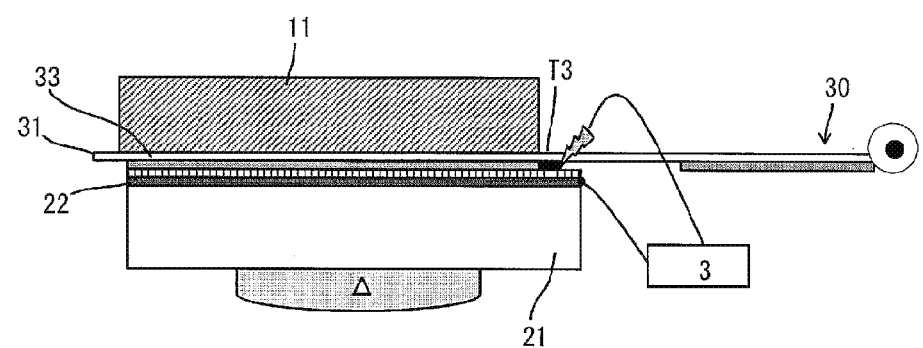

FIG. 21
(a)
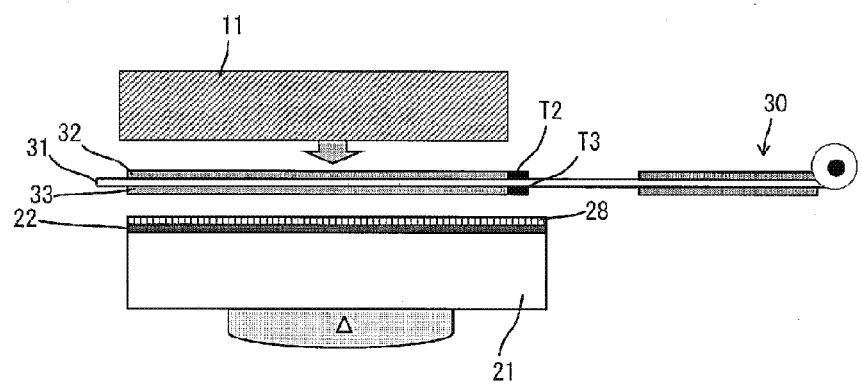
(b)
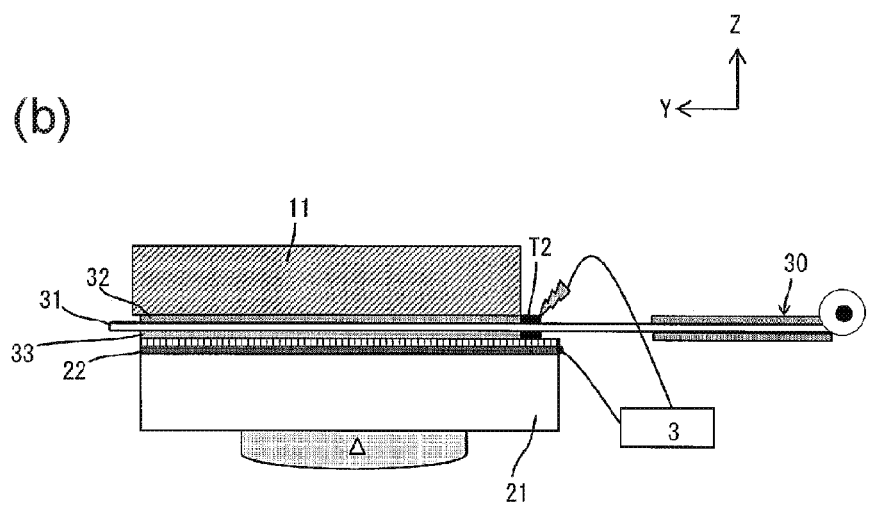
(c)
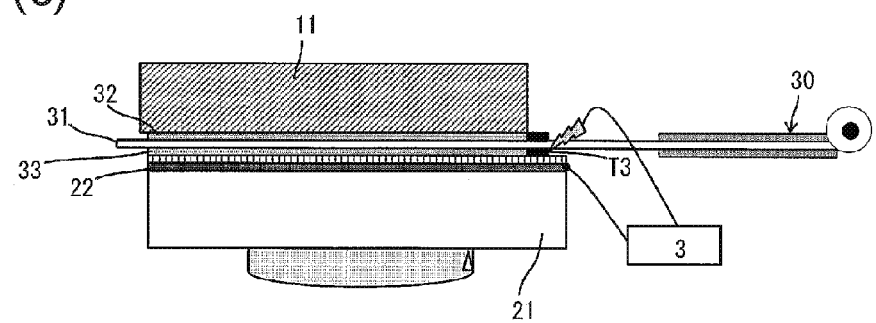

FIG. 23
(a)
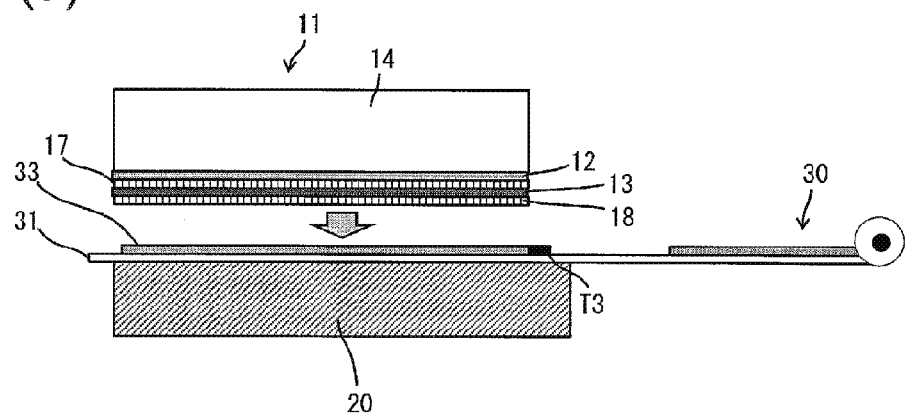
(b)
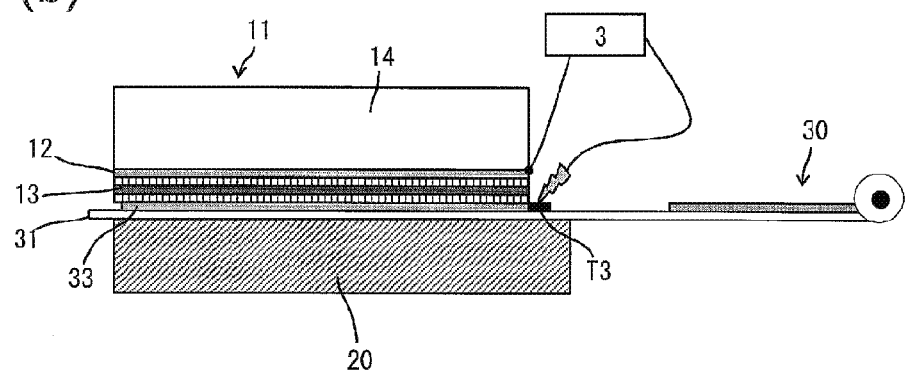

FIG. 24
(a)
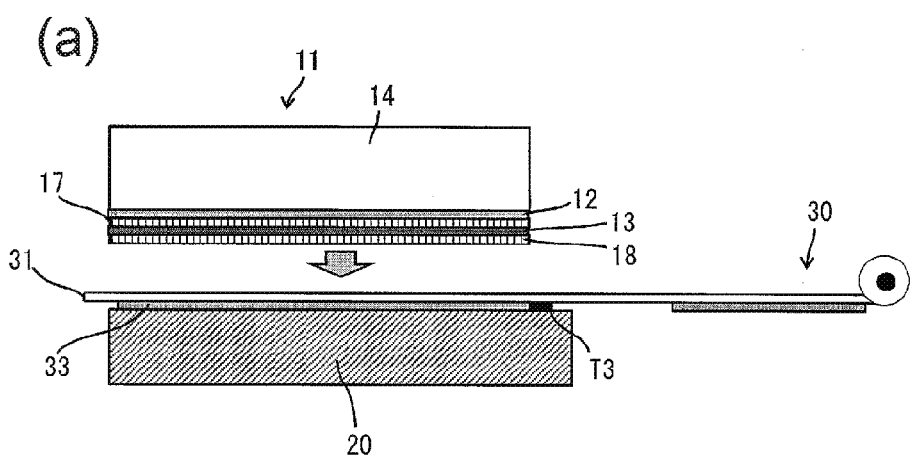
(b)
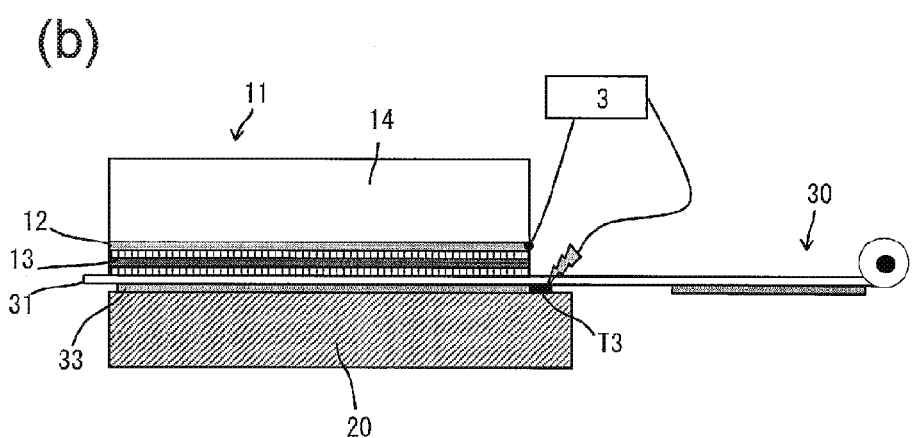

FIG. 25
(a)
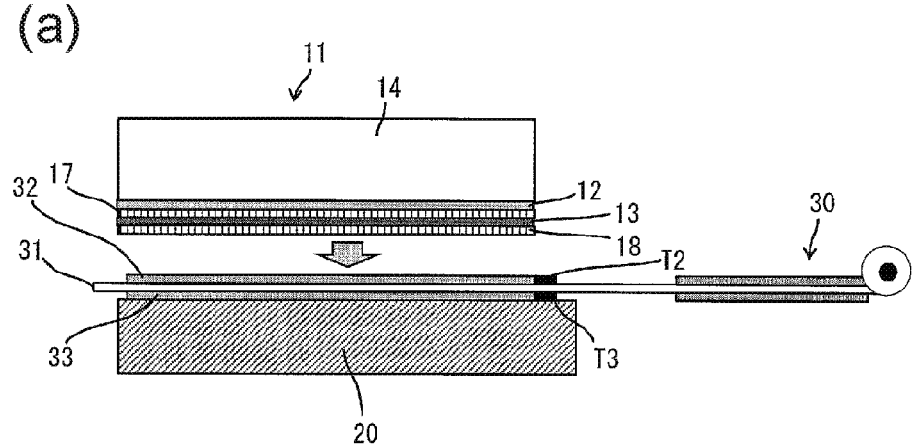
(b)
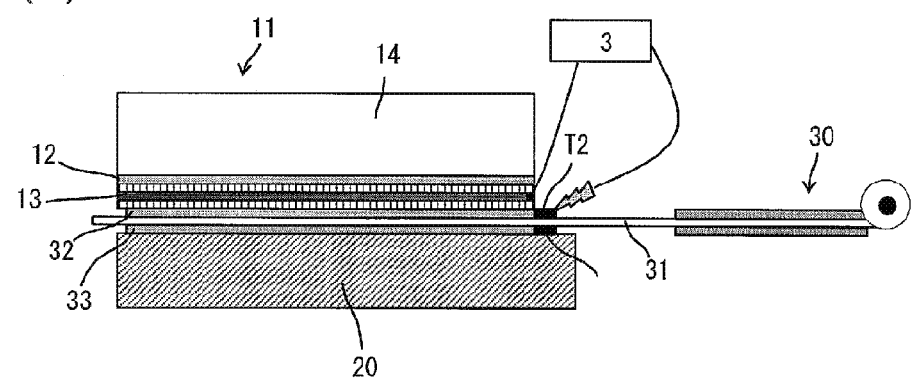
(c)
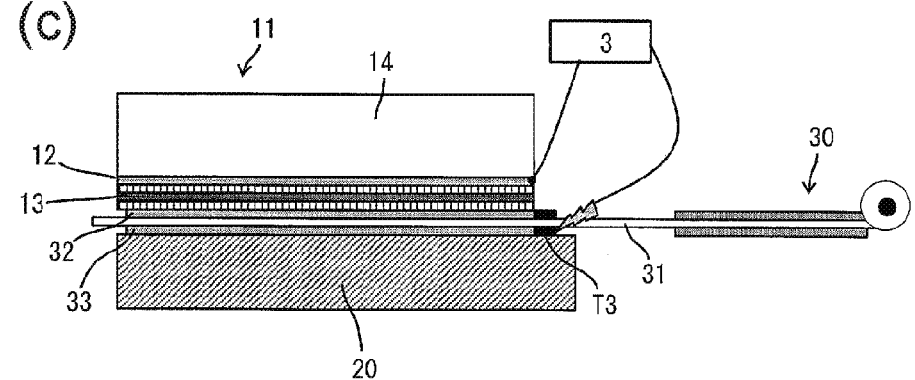

INSPECTION DEVICE

TECHNICAL FIELD

The present invention relates to inspection of touch sensors.

BACKGROUND ART

Patent Document 1 discloses a method for inspecting a sensor module that includes two sensor electrode layers (a sensor electrode layer made from sensor electrodes that run in the row direction and a sensor electrode layer made from sensor electrodes that run in the column direction) for defects by arranging an inspection fixture that includes island-shaped electrodes arranged in a matrix pattern facing the sensor module and then applying a prescribed voltage to the inspection electrodes.

RELATED ART DOCUMENT

Patent Document

Patent Document 1: Japanese Patent Application Laid-Open Publication, "Japanese Patent Application Laid-Open Publication No. 2010-86026 (Published on Apr. 15, 2010)"

SUMMARY OF THE INVENTION

Problems to be Solved by the Invention

The inspection method disclosed in Patent Document 1 assumes that two sensor electrode layers are formed. However, in order to improve yield rate, it is preferable that it be possible to perform the inspection at a stage when only one of the two sensor electrode layers has been formed.

Means for Solving the Problems

A method of inspecting a sensor sheet formed by a roll-to-roll scheme for a touch sensor, the sensor sheet including a roll sheet and a sensor electrode layer on the roll sheet, the sensor electrode including a plurality of sensor electrodes running in a prescribed direction, the sensor sheet further including a terminal connected to the sensor electrode layer and alignment marks, the method including: arranging the sensor sheet on an inspection table of an inspection device, the inspection table having an alignment mark and a plurality of inspection electrodes running in another prescribed direction, the sensor sheet being arranged on the inspection table such that at least one of the alignment marks aligns with the alignment mark on the inspection table and such that the inspection electrodes of the inspection device face the sensor electrodes of the sensor electrode layer in an orthogonal fashion in a plan view and are vertically separated therefrom by a dielectric material so as to form capacitances at respective intersections between the inspection electrodes and the sensor electrodes that are arranged to be orthogonal to one another; measuring the capacitances at the respective intersections; and outputting the measured capacitances as an inspection result.

Effects of the Invention

The inspection electrode layer and the sensor electrode layer form a configuration equivalent to a touch sensor, thereby making it possible to perform the inspection in a state in which only one of the sensor electrode layers has been formed and also making it possible to increase the inspection precision.

BRIEF DESCRIPTION OF THE DRAWINGS

FIG. 3 is a perspective view illustrating a configuration of a sensor sheet.

FIG. 7 is a cross-sectional view of the example usage illustrated in FIG. 6.

FIG. 10 is a cross-sectional view illustrating another example of using the inspection device according to Embodiment 1.

FIG. 12 is a cross-sectional view of the example usage illustrated in FIG. 11.

FIG. 14 is a cross-sectional view illustrating yet another example of using the inspection device according to Embodiment 1.

FIG. 16 is a cross-sectional view illustrating an example of using the inspection device illustrated in FIG. 15.

FIG. 18 is a cross-sectional view of the example usage illustrated in FIG. 17.

FIG. 19 is a cross-sectional view illustrating another example of using the inspection device according to Embodiment 2.

FIG. 20 is a cross-sectional view illustrating yet another example of using the inspection device according to Embodiment 2.

FIG. 21 is a cross-sectional view illustrating yet another example of using the inspection device according to Embodiment 2.

FIG. 23 is a cross-sectional view illustrating an example of using the inspection device illustrated in FIG. 22.

FIG. 24 is a cross-sectional view illustrating another example of using the inspection device according to Embodiment 3.

FIG. 25 is a cross-sectional view illustrating yet another example of using the inspection device according to Embodiment 3.

DETAILED DESCRIPTION OF EMBODIMENTS

Embodiments of the present invention will be described below with reference to FIGS. 1 to 28.

Embodiment 1

Figure 1:
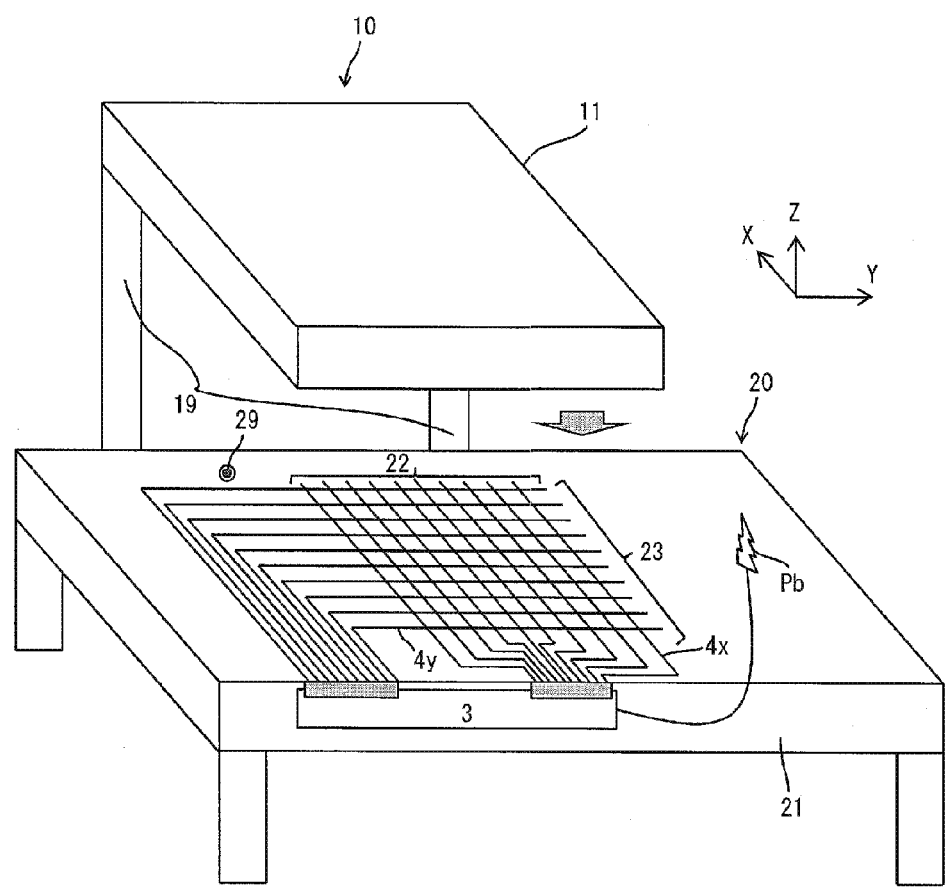
FIG. 1 is a perspective view illustrating a configuration of an inspection device according to Embodiment 1.
Figure 2:
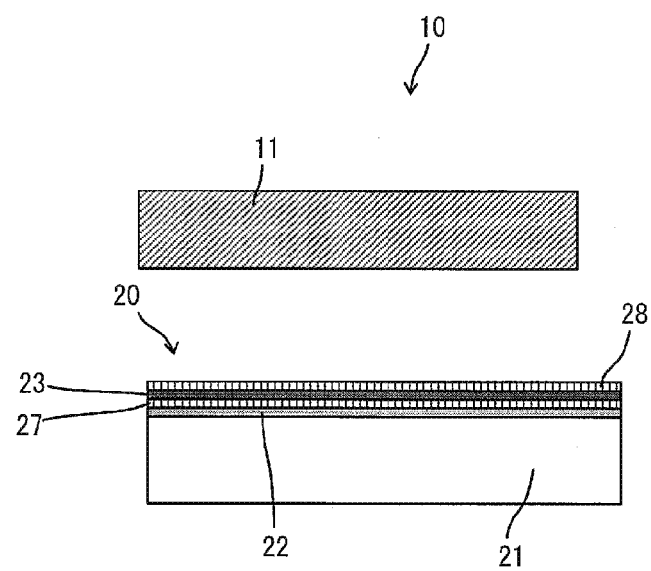
FIG. 2 is a cross-sectional view illustrating the configuration of the inspection device according to Embodiment 1.
Figure 4:
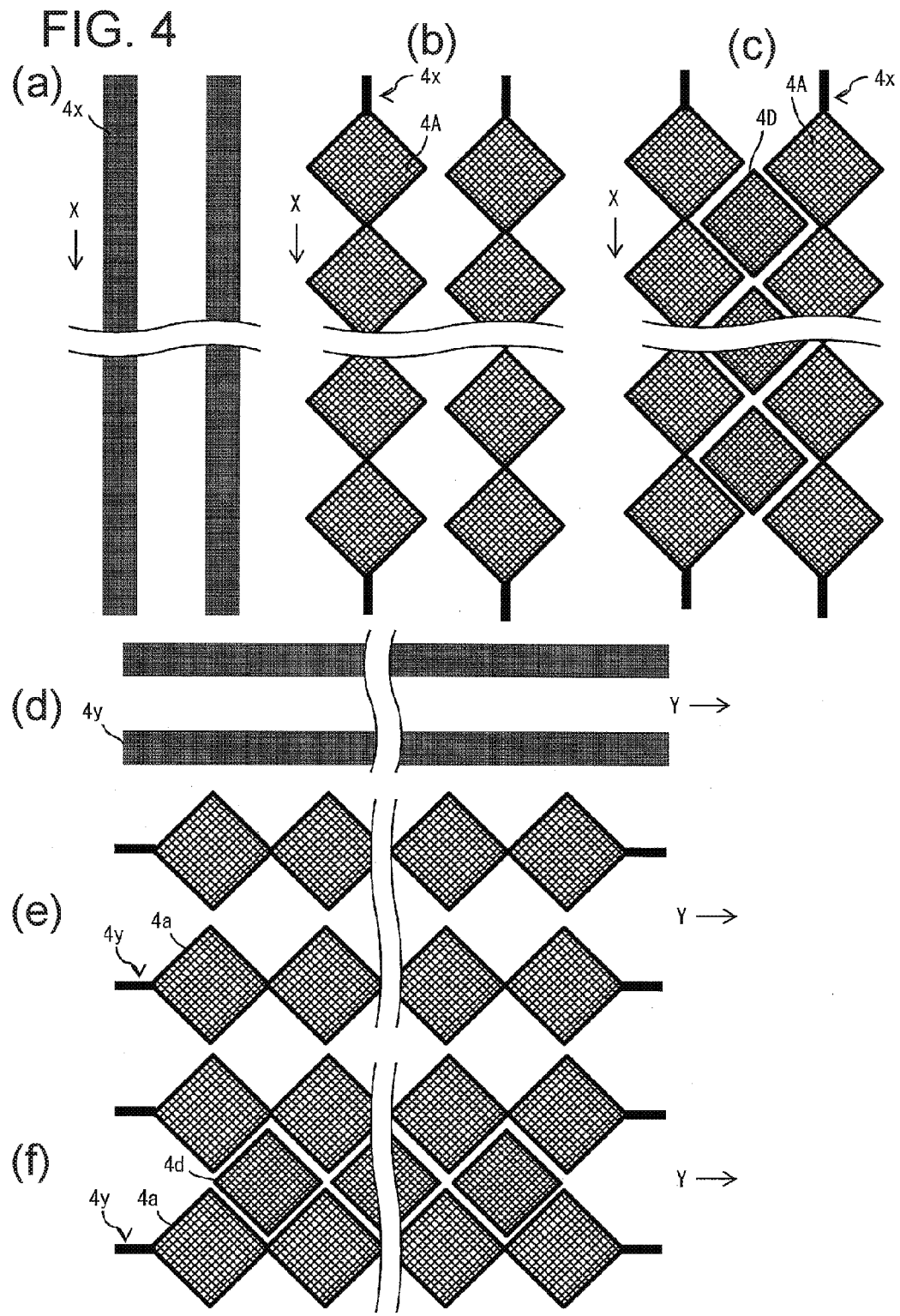
FIG. 4 is an enlarged view of inspection electrodes.
Figure 5:
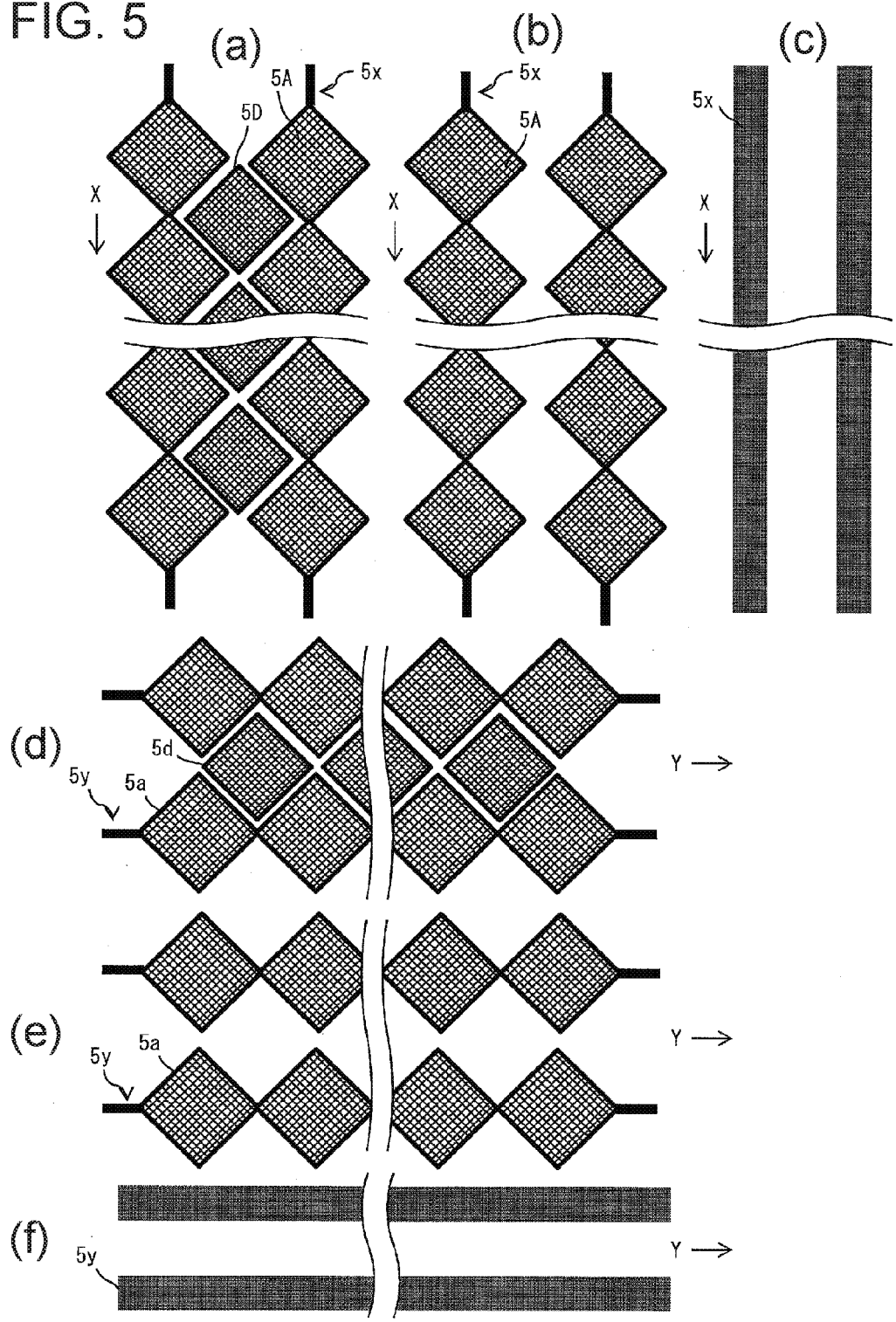
FIG. 5 is an enlarged view of sensor electrodes.

FIG. 1 is a cross-sectional view illustrating a configuration of an inspection device. FIG. 2 is a cross-sectional view illustrating the configuration of the inspection device. As illustrated in FIGS. 1 and 2, the inspection device 10 includes an inspection table 20, a weight 11, supports 19, and a controller 3. The inspection table 20 includes a dielectric stage 21, a first inspection electrode layer 22 made from a plurality of X-direction inspection electrodes 4x that run in the X-direction, a second inspection electrode layer 23 made from a plurality of Y-direction inspection electrodes 4y that run in the Y-direction, a first dielectric layer 27, and a second dielectric layer 28. The X-direction and the Y-direction are mutually orthogonal and run parallel to the top surface of the inspection table 20. The Z-direction (the vertical direction) is orthogonal to the top surface of the inspection table 20. The weight 11 is a dielectric plate made from glass or the like and is arranged above the inspection table 20, supported by the supports 19. The weight 11 can be moved in the vertical direction.

On the inspection table 20, the first inspection electrode layer 22 is formed on top of the dielectric stage 21. The first dielectric layer 27 is made from a material such as polyethylene terephthalate (PET) or a cyclic olefin polymer (COP) and is formed on top of the first inspection electrode layer 22. The second inspection electrode layer 23 is formed on top of the first dielectric layer 27. The second dielectric layer 28 is made from a material such as PET or a COP and is formed on top of the second inspection electrode layer 23. The first inspection electrode layer 22 and the second inspection electrode layer 23 are connected via switches (not illustrated in the figure) to the controller 3, and a probe Pb is connected to the controller 3. Furthermore, an alignment mark 29 is formed on the inspection table 20.

FIG. 3 is a perspective view illustrating a configuration of a sensor sheet for a touch sensor (an item to be inspected). This sensor sheet is formed using the so-called roll-to-roll method, and the axis of the roll is arranged parallel to the X-direction. In the sensor sheet 30 illustrated in FIG. 3(a) (the item to be inspected), a sensor electrode layer 32 made from a plurality of X-direction sensor electrodes 5x that run in the X-direction as well as a terminal T2 that is connected to the sensor electrode layer 32 are formed on one side (the top side) of a roll sheet 31. In the sensor sheet 30 illustrated in FIG. 3(b) (the item to be inspected), a sensor electrode layer 33 made from a plurality of Y-direction sensor electrodes 5y that run in the Y-direction as well as a terminal T3 that is connected to the sensor electrode layer 33 are formed on one side (the top side) of a roll sheet 31. Furthermore, alignment marks 39 are formed on the roll sheets 31 illustrated in FIGS. 3(a) and 3(b).

FIG. 4(a) is an enlarged partial view of the first inspection electrode layer 22. As illustrated in FIG. 4(a), the plurality of X-direction inspection electrodes 4x of the first inspection electrode layer 22 are band-shaped and are arranged in a stripe pattern. Note, however, that the first inspection electrode layer 22 is not limited to the configuration illustrated in FIG. 4(a). As illustrated in FIG. 4(b), the X-direction inspection electrodes 4x may be formed as a plurality of mesh-patterned electrodes 4A connected together in the X-direction, and as illustrated in FIG. 4(c), a plurality of floating dummy electrodes 4D may be arranged in the X-direction between adjacent X-direction inspection electrodes 4x of the type illustrated in FIG. 4(b).

FIG. 4(d) is an enlarged partial view of the second inspection electrode layer 23. As illustrated in FIG. 4(d), the plurality of Y-direction inspection electrodes 4y of the second inspection electrode layer 23 are band-shaped and are arranged in a stripe pattern. Note, however, that the second inspection electrode layer 23 is not limited to the configuration illustrated in FIG. 4(d). As illustrated in FIG. 4(e), the Y-direction inspection electrodes 4y may be formed as a plurality of mesh-patterned electrodes 4a connected together in the Y-direction, and as illustrated in FIG. 4(f), a plurality of floating dummy electrodes 4d may be arranged in the Y-direction between adjacent Y-direction inspection electrodes 4y of the type illustrated in FIG. 4(e).

FIG. 5(a) is an enlarged partial view of the sensor electrode layer 32 illustrated in FIG. 3(a). The X-direction sensor electrodes 5x are formed as a plurality of mesh-patterned electrodes 5A connected together in the X-direction, and a plurality of floating dummy electrodes 5D are arranged in the X-direction between adjacent X-direction sensor electrodes 5x. Note, however, that the sensor electrode layer 32 is not limited to the configuration illustrated in FIG. 5(a). As illustrated in FIG. 5(b), the dummy electrodes 5D may be removed from the configuration illustrated in FIG. 5(a), or as illustrated in FIG. 5(c), the plurality of X-direction sensor electrodes 5x may be band-shaped and arranged in a stripe pattern.

FIG. 5(d) is an enlarged partial view of the sensor electrode layer 33 illustrated in FIG. 3(b). The Y-direction sensor electrodes 5y are formed as a plurality of mesh-patterned electrodes 5a connected together in the Y-direction, and a plurality of floating dummy electrodes 5d are arranged in the Y-direction between adjacent Y-direction sensor electrodes 5y. Note, however, that the sensor electrode layer 33 is not limited to the configuration illustrated in FIG. 5(d). As illustrated in FIG. 5(e), the dummy electrodes 5d may be removed from the configuration illustrated in FIG. 5(d), or as illustrated in FIG. 5(f), the plurality of Y-direction sensor electrodes 5y may be band-shaped and arranged in a stripe pattern.

Figure 6:
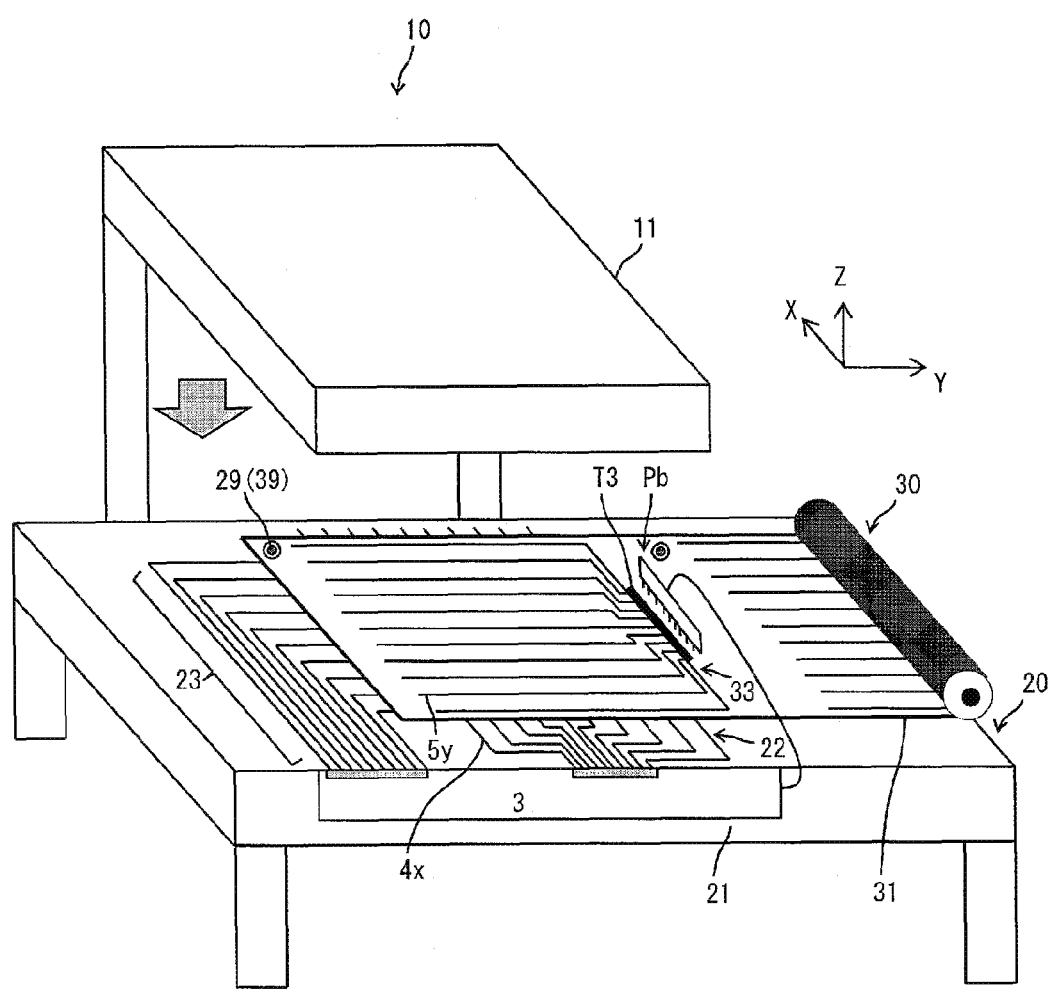
FIG. 6 is a perspective view illustrating an example of using the inspection device illustrated in FIG. 1.

As illustrated in FIGS. 6 and 7, during inspection, the sensor sheet 30 illustrated in FIG. 3(b) is arranged on the inspection table 20 such that one of the alignment marks 39 on the roll sheet 31 aligns with the alignment mark 29 on the inspection table 20. Then, the weight 11 is lowered into contact with the sensor electrode layer 33 (thereby applying a prescribed pressure to the sensor sheet 30). In this way, the region of the first inspection electrode layer 22 in which the X-direction inspection electrodes 4x are formed faces the region of the sensor electrode layer 33 in which the Y-direction sensor electrodes 5y are formed, and these regions are separated from one another by a dielectric material (the first and second dielectric layers 27 and 28 as well as the roll sheet 31). This arrangement causes capacitance (electrical capacitance) to form between the mutually orthogonal X-direction inspection electrodes 4x (see FIG. 4(a), for example) and the Y-direction sensor electrodes 5y (see FIG. 5(d), for example). Furthermore, the switch between the first inspection electrode layer 22 and the controller 3 is turned ON (and the switch between the second inspection electrode layer 23 and the controller 3 is turned OFF), and the probe Pb connected to the controller 3 is brought into contact with the terminal T3.

Figure 8:
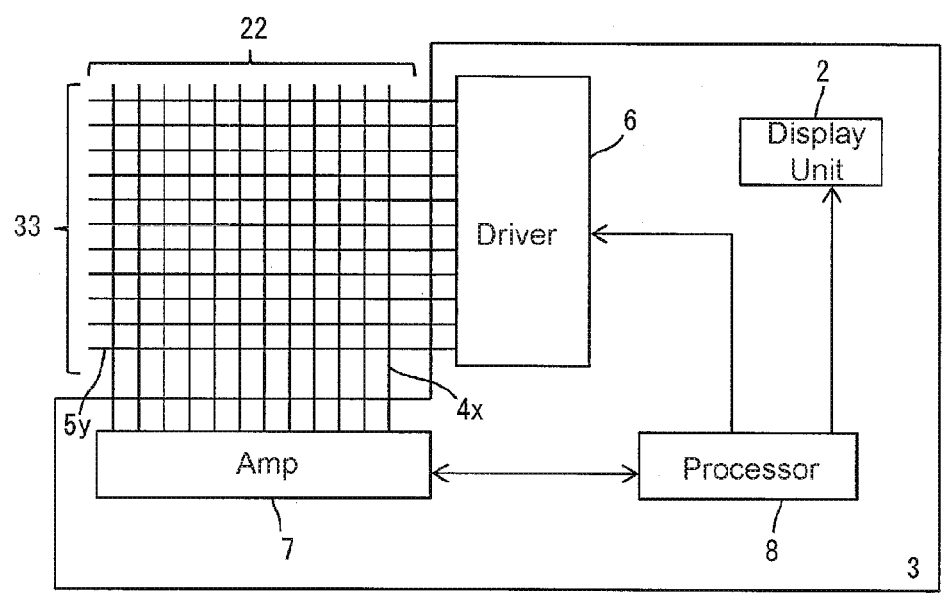
FIG. 8 is a block diagram illustrating a configuration of a controller.

As illustrated in FIG. 8, the controller 3 includes a driver 6, an amp 7, a processor 8, and a display unit 2. The driver 6 receives instructions from the processor 8 and sends drive signals to the sensor electrode layer 33. The amp 7 amplifies detection signals from the first inspection electrode layer 22 and sends those signals to the processor 8. The processor 8 processes the amplified detection signals and outputs an inspection result to the display unit 2.

In Embodiment 1, the first inspection electrode layer 22 and the sensor electrode layer 33 form a configuration equivalent to a touch sensor, thereby making it possible to perform the inspection in a state in which only one of the sensor electrode layers has been formed and also making it possible to increase the inspection precision.

The first inspection electrode layer 22 must be completely free of defects, and therefore a simple configuration such as that illustrated in FIG. 4(a) (band-shaped solid electrodes arranged in a stripe pattern) is suitable. However, if the sensor electrode layer 33 is configured as illustrated in FIG. 5(d), the first inspection electrode layer 22 may be configured as illustrated in FIG. 4(b) or 4(c) to match the configuration of the sensor electrode layer 33. Moreover, when the sensor electrode layer 33 is configured as illustrated in FIG. 5(d) and the first inspection electrode layer 22 is configured as illustrated in FIG. 4(b) or 4(c), the first inspection electrode layer 22 and the sensor electrode layer 33 should be arranged such that the mesh-patterned electrodes 4A of the first inspection electrode layer 22 overlap with the dummy electrodes 5d of the sensor electrode layer 33.

Moreover, as illustrated in FIGS. 6 and 7, making the bottom surface (the surface facing the inspection table 20) of the weight 11 (which is a dielectric plate) larger than the region of the first inspection electrode layer 22 in which the X-direction inspection electrodes 4x are formed ensures that when the weight 11 is lowered into close contact with the sensor sheet 30, the bottom surface of the weight 11 fully covers the region of the first inspection electrode layer 22 in which the X-direction inspection electrodes 4x are formed and the region of the sensor electrode layer 33 in which the Y-direction sensor electrodes 5y are formed. This makes it possible to reduce external noise during inspection.

Next, the operation of the controller 3 will be described in more detail. The driver 6 (see FIG. 8) sequentially selects the Y-direction sensor electrodes 5y. While the Nth Y-direction sensor electrode 5y is selected, the processor 8 illustrated in FIG. 8 uses the 1st to Mth sensor signals (voltage signals) output by the 1st to Mth X-direction inspection electrodes 4x to calculate 1st to Mth capacitance values for the Nth Y-direction sensor electrode 5y. Next, while the (N+1)th Y-direction sensor electrode 5y is selected, the processor 8 uses the 1st to Mth sensor signals (voltage signals) output by the 1st to Mth X-direction inspection electrodes 4x to calculate 1st to Mth capacitance values for the (N+1)th Y-direction sensor electrode 5y. Next, the processor 8 generates an inspection result on the basis of the differences between the ith capacitance value (where i is a number from 1 to M) for the Nth Y-direction sensor electrode 5y and the ith capacitance value for the (N+1)th Y-direction sensor electrode 5y. For example, if some of these differences exceed or are less than a threshold value, it is determined that there are defects in electrode formation, and if the differences are uniform throughout the test plane, it is determined that there are no defects in electrode formation. This makes it possible to obtain a high precision inspection result in which the effects of external noise are negligible (that is, an inspection result with an excellent S/N ratio), thereby making it possible to detect severed electrodes and variations in electrode width in the Y-direction sensor electrodes 5y, shorts between adjacent Y-direction sensor electrodes 5y, and even micro-shorts between the Y-direction sensor electrodes 5y and the dummy electrodes.

As a modification example of the configuration illustrated in FIG. 8, the driver 6 may send drive signals to the first inspection electrode layer 22, and the amp 7 may amplify detection signals from the sensor electrode layer 33 and send those detection signals to the processor 8.

Figure 9:
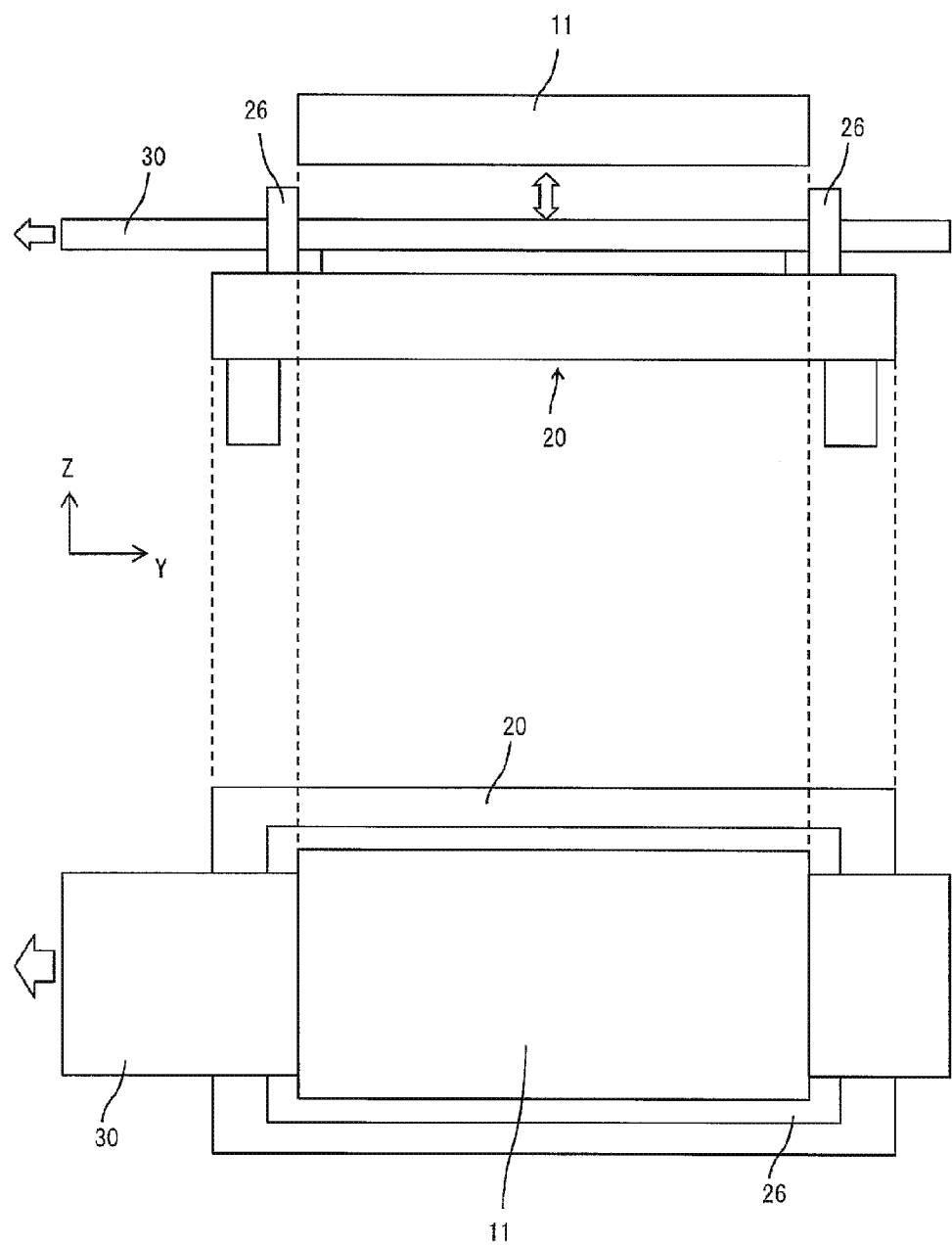
FIG. 9 includes a cross-sectional view and a top view illustrating another example of a configuration for the inspection device according to Embodiment 1.

FIG. 9 illustrates another example of a configuration for the device illustrated in FIG. 6. The upper half of FIG. 9 is a side view, and the bottom half of FIG. 9 is a top view. As illustrated in FIG. 9, a sheet setting enclosure 26 that surrounds the sensor sheet 30 is arranged on top of the inspection table 20 and is configured such that the weight 11 fits within the sheet setting enclosure 26 when lowered.

In FIG. 7, the sensor electrode layer 33 is formed on the top surface of the roll sheet 31. However, if as illustrated in FIG. 10(a), the sensor electrode layer 33 is formed on the bottom surface of the roll sheet 31, the inspection may be performed as illustrated in FIG. 10(b).

Figure 11:
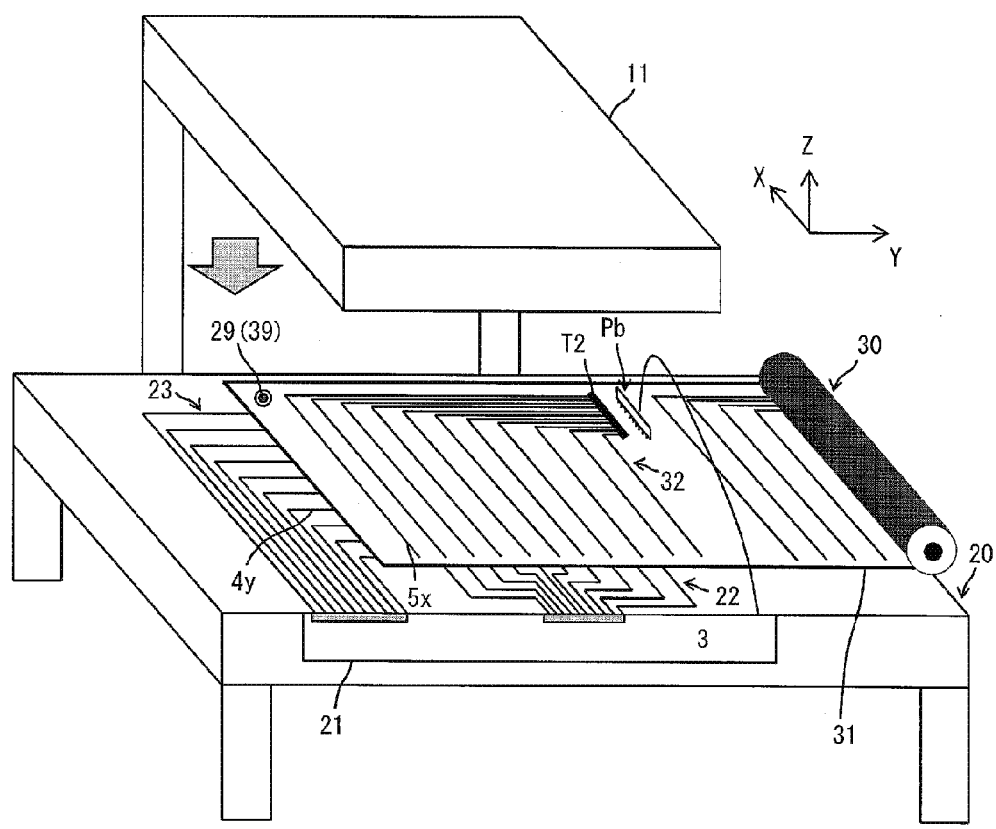
FIG. 11 is a perspective view illustrating yet another example of using the inspection device according to Embodiment 1.
Figure 13:
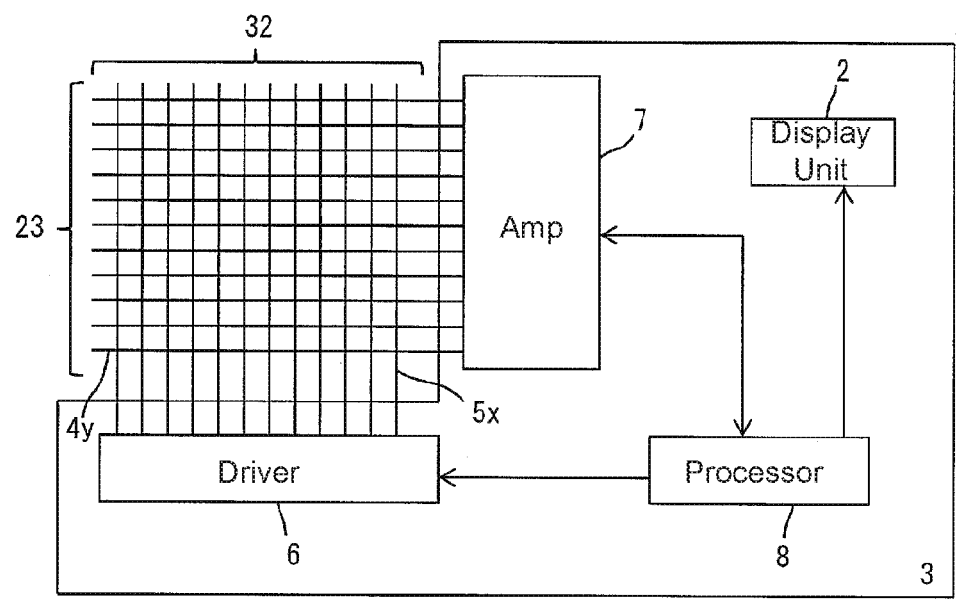
FIG. 13 is a block diagram illustrating another configuration for the controller.

FIGS. 11 and 12 illustrate an inspection method for when the sensor electrode layer 32 (which includes the X-direction sensor electrodes 5x) is formed on the top surface of the roll sheet 31. In this case, the sensor sheet 30 illustrated in FIG. 3(a) is arranged on the inspection table 20 such that one of the alignment marks 39 on the roll sheet 31 aligns with the alignment mark 29 on the inspection table 20. Then, the weight 11 is lowered into contact with the sensor electrode layer 32 (thereby applying a prescribed pressure to the sensor sheet 30). In this way, the sensor electrode layer 32 faces the second inspection electrode layer 23 and is separated therefrom by a dielectric material (the first and second dielectric layers 27 and 28 as well as the roll sheet 31). This arrangement causes capacitance (electrical capacitance) to form between the Y-direction inspection electrodes 4y and the X-direction sensor electrodes 5x. Furthermore, the switch between the second inspection electrode layer 23 and the controller 3 is turned ON (and the switch between the first inspection electrode layer 22 and the controller 3 is turned OFF), and the probe Pb connected to the controller 3 is brought into contact with the terminal T2. In this case, as illustrated in FIG. 13, the driver 6 receives instructions from the processor 8 and sends drive signals to the sensor electrode layer 32. The amp 7 amplifies detection signals from the second inspection electrode layer 23 and sends those signals to the processor 8. The processor 8 processes the amplified detection signals and outputs an inspection result to the display unit 2.

Moreover, if as illustrated in FIG. 14(a), the sensor electrode layer 32 (which includes the X-direction sensor electrodes 5x) is formed on the top surface of the roll sheet 31 and the sensor electrode layer 33 (which includes the Y-direction sensor electrodes 5y) is formed on the bottom surface of the roll sheet 31, the inspection may be performed as illustrated in FIGS. 14(b) and 14(c). In other words, when inspecting the sensor electrode layer 32, as illustrated in FIG. 14(b), the switch between the second inspection electrode layer 23 and the controller 3 is turned ON (and the switch between the first inspection electrode layer 22 and the controller 3 is turned OFF), and the probe Pb connected to the controller 3 is brought into contact with the terminal T2. Then, when inspecting the sensor electrode layer 33, as illustrated in FIG. 14(c), the switch between the first inspection electrode layer 22 and the controller 3 is turned ON (and the switch between the second inspection electrode layer 23 and the controller 3 is turned OFF), and the probe Pb connected to the controller 3 is brought into contact with the terminal T3.

Figure 15:
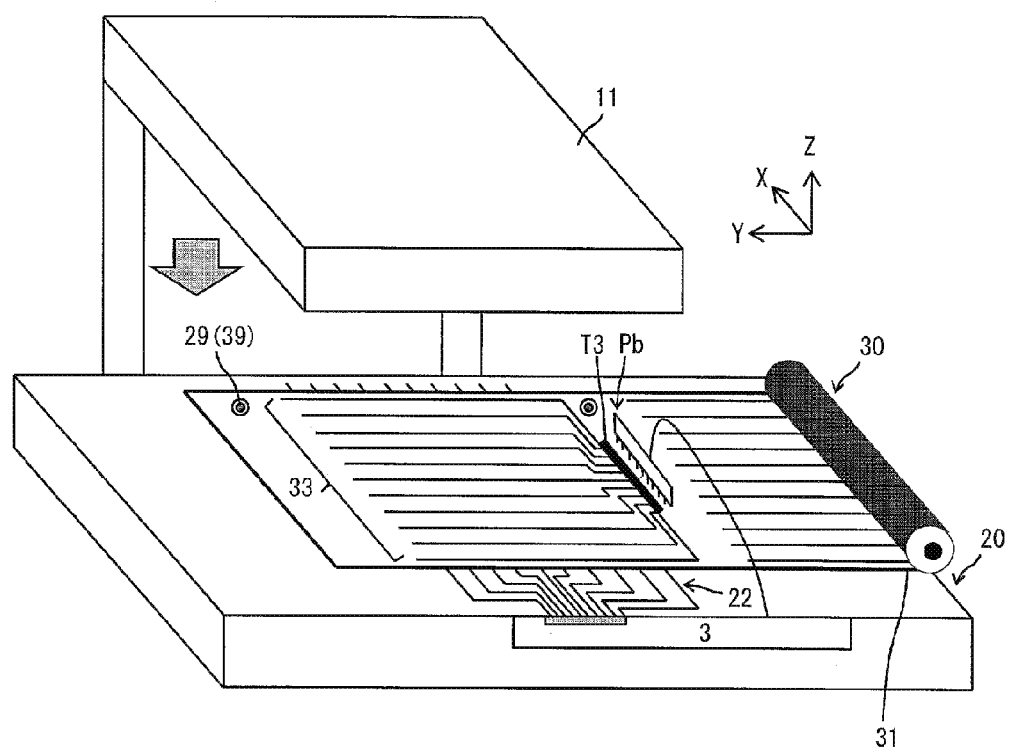
FIG. 15 is a perspective view illustrating another example of a configuration for the inspection device according to Embodiment 1.

In FIG. 1, the inspection table 20 includes the first inspection electrode layer 22 and the second inspection electrode layer 23. However, the inspection device 10 is not limited to this configuration. As illustrated in FIGS. 15 and 16, the inspection table 20 may include only the first inspection electrode layer 22, and the first inspection electrode layer 22 may be connected to the controller 3. In this case, the sensor sheet 30 illustrated in FIG. 3(b) is arranged on the inspection table 20 such that one of the alignment marks 39 on the roll sheet 31 aligns with the alignment mark 29 on the inspection table 20. Then, the weight 11 is lowered into contact with the sensor electrode layer 33 (thereby applying a prescribed pressure to the sensor sheet 30). In this way, the sensor electrode layer 33 faces the first inspection electrode layer 22 and is separated therefrom by a dielectric material (the first and second dielectric layers 27 and 28 as well as the roll sheet 31). This arrangement causes capacitance (electrical capacitance) to form between the X-direction inspection electrodes 4x and the Y-direction sensor electrodes 5y. Next, the probe Pb connected to the controller 3 is brought into contact with the terminal T3.

Embodiment 2

Figure 17:
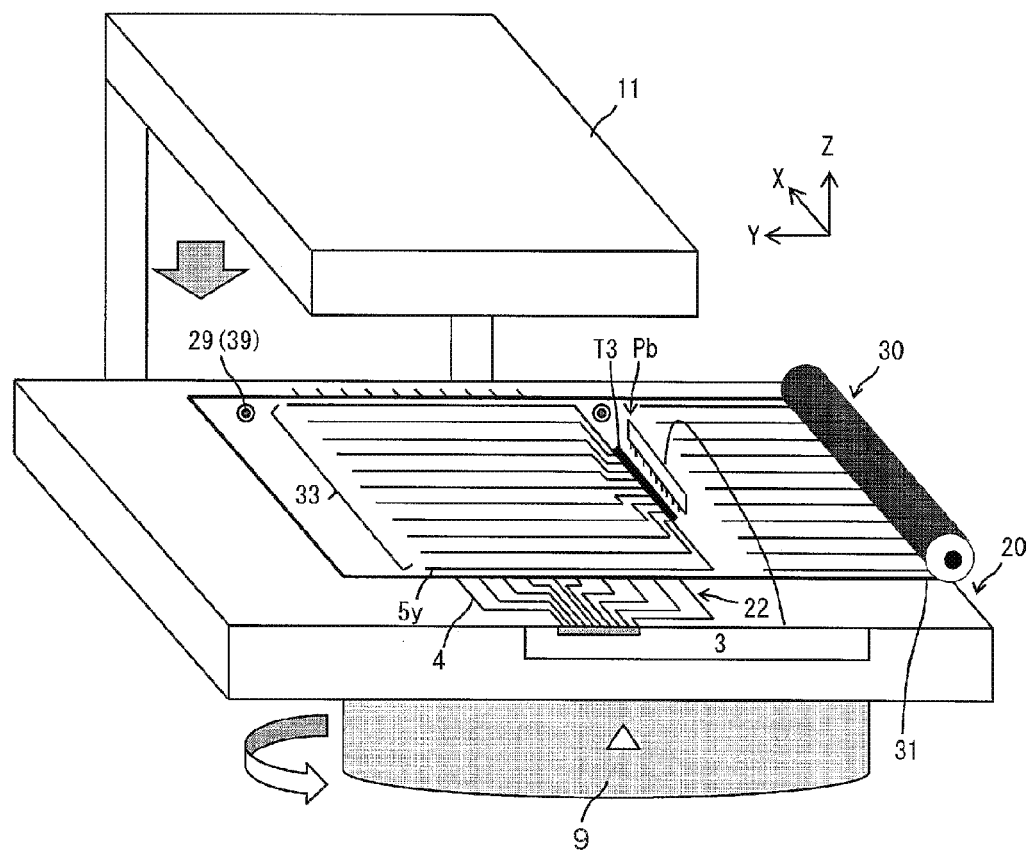
FIG. 17 is a perspective view illustrating an example of a configuration of an inspection device according to Embodiment 2.

As illustrated in FIG. 17, the inspection table 20 may be rotatably supported by a rotating member 9 arranged below the inspection table 20. In this case, the inspection table 20 includes only the first inspection electrode layer 22, and the first inspection electrode layer 22 is connected to the controller 3.

As illustrated in FIGS. 17 and 18, the sensor sheet 30 illustrated in FIG. 3(b) is arranged on the inspection table 20 such that one of the alignment marks 39 on the roll sheet 31 aligns with the alignment mark 29 on the inspection table 20. Then, the weight 11 is lowered into contact with the sensor electrode layer 33 (thereby applying a prescribed pressure to the sensor sheet 30). In this way, the sensor electrode layer 33 faces the first inspection electrode layer 22 and is separated therefrom by a dielectric material (the first dielectric layer 27 as well as the roll sheet 31). This arrangement causes capacitance (electrical capacitance) to form between inspection electrodes 4 and the Y-direction sensor electrodes 5y. Next, the probe Pb connected to the controller 3 is brought into contact with the terminal T3.

As illustrated in FIG. 19, when inspecting the sensor sheet 30 illustrated in FIG. 3(a), the inspection table 20 is rotated by 90° such that the inspection electrodes 4 of the first inspection electrode layer 22 run in the Y-direction, and then the weight 11 is lowered into contact with the sensor electrode layer 32 (thereby applying a prescribed pressure to the sensor sheet 30). In this way, the sensor electrode layer 32 faces the first inspection electrode layer 22 and is separated therefrom by a dielectric material (the first dielectric layer 27 and the roll sheet 31). This arrangement causes capacitance (electrical capacitance) to form between the X-direction sensor electrodes 5x of the sensor electrode layer 32 (see FIG. 3(a)) and the inspection electrodes 4 that have been rotated to be parallel to the Y-direction. Next, the probe Pb connected to the controller 3 is brought into contact with the terminal T3.

In FIG. 18, the sensor electrode layer 33 is formed on the top surface of the roll sheet 31. However, if as illustrated in FIG. 20(a), the sensor electrode layer 33 is formed on the bottom surface of the roll sheet 31, the inspection may be performed as illustrated in FIG. 20(b).

Moreover, if as illustrated in FIG. 21(a), the sensor electrode layer 32 (which includes the X-direction sensor electrodes 5x) is formed on the top surface of the roll sheet 31 and the sensor electrode layer 33 (which includes the Y-direction sensor electrodes 5y) is formed on the bottom surface of the roll sheet 31, the inspection may be performed as illustrated in FIGS. 21(b) and 21(c). In other words, as illustrated in FIG. 21(b), when inspecting the sensor electrode layer 32, the probe Pb connected to the controller 3 is brought into contact with the terminal T2. Moreover, as illustrated in FIG. 21(c), when inspecting the sensor electrode layer 33, the inspection table 20 is rotated by 90° such that the inspection electrodes 4 of the first inspection electrode layer 22 run in the Y-direction, and then the probe Pb connected to the controller 3 is brought into contact with the terminal T3.

Embodiment 3

Figure 22:
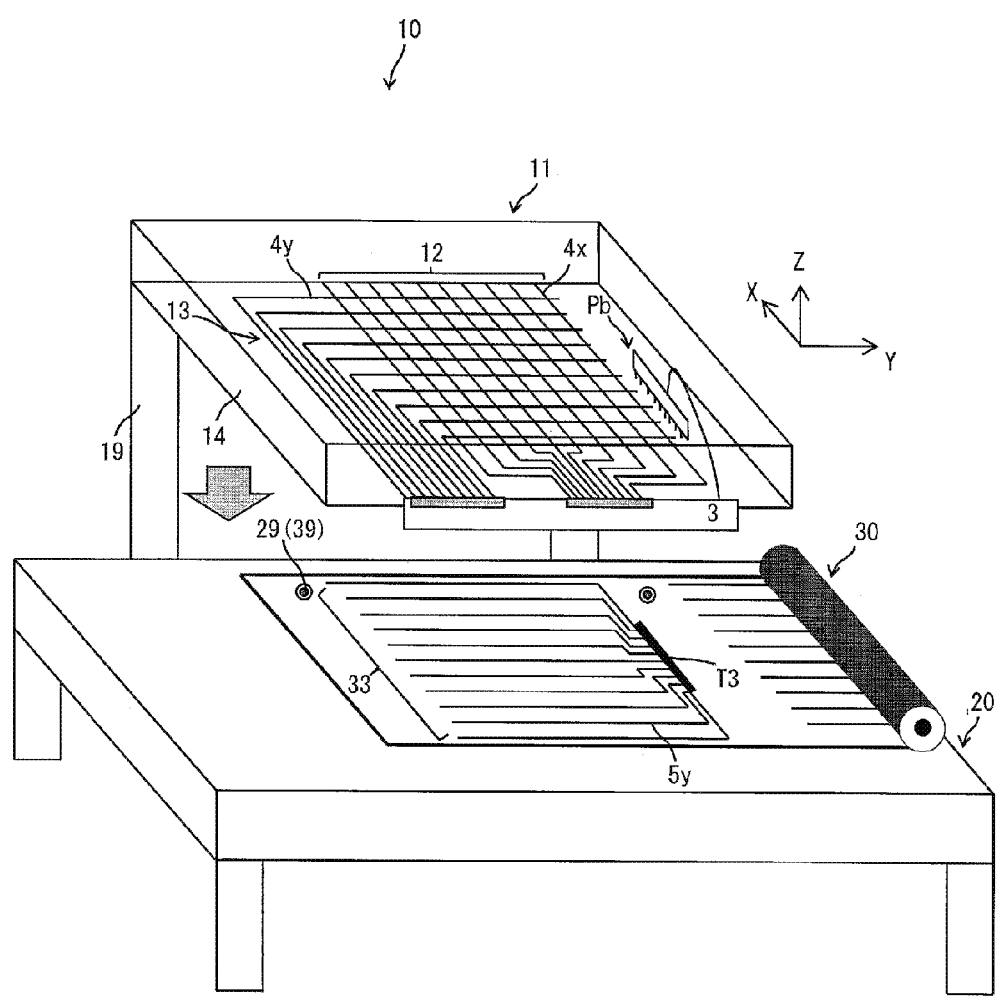
FIG. 22 is a perspective view illustrating an example of a configuration of an inspection device according to Embodiment 3.

As illustrated in FIGS. 22 and 23, an inspection device 10 includes an inspection table 20, a weight 11, a support 19, and a controller 3. The weight 11 includes a dielectric plate 14, a first inspection electrode layer 12 made from a plurality of X-direction inspection electrodes 4x that run in the X-direction, a second inspection electrode layer 13 made from a plurality of Y-direction inspection electrodes 4y that run in the Y-direction, a first dielectric layer 17, and a second dielectric layer 18. The weight 11 is arranged above the inspection table 20, supported by the support 19. The weight 11 can be moved in the vertical direction.

On the weight 11, the first inspection electrode layer 12 is formed in contact with the dielectric plate 14. The first dielectric layer 17 is formed in contact with the first inspection electrode layer 12. The second inspection electrode layer 13 is formed on top of the first dielectric layer 17. The second dielectric layer 18 is formed in contact with the second inspection electrode layer 13. The first inspection electrode layer 12 and the second inspection electrode layer 13 are connected via switches (not illustrated in the figure) to the controller 3, and a probe Pb is connected to the controller 3. Furthermore, an alignment mark 29 is formed on the inspection table 20.

As illustrated in FIGS. 22 and 23, during inspection, the sensor sheet 30 illustrated in FIG. 3(b) is arranged on the inspection table 20 such that one of the alignment marks 39 on the roll sheet 31 aligns with the alignment mark 29 on the inspection table 20. Then, the weight 11 is lowered into contact with the sensor electrode layer 33 (thereby applying a prescribed pressure to the sensor sheet 30). In this way, the sensor electrode layer 33 faces the first inspection electrode layer 12 and is separated therefrom by a dielectric material (the first and second dielectric layers 17 and 18). This arrangement causes capacitance (electrical capacitance) to form between the X-direction inspection electrodes 4x and the Y-direction sensor electrodes 5y. Next, the switch between the first inspection electrode layer 12 and the controller 3 is turned ON (and the switch between the second inspection electrode layer 13 and the controller 3 is turned OFF). Moreover, a probe Pb connected to the controller 3 is formed on the bottom surface of the weight 11 such that the probe Pb can be brought into contact with the terminal T3 simply by lowering the weight 11.

As illustrated in FIG. 8, in the controller 3 the driver 6 receives instructions from the processor 8 and drives the sensor electrode layer 33. The amp 7 amplifies detection signals from the first inspection electrode layer 12 and sends those signals to the processor 8. The processor 8 processes the amplified detection signals and outputs an inspection result to the display unit 2.

In FIG. 23, the sensor electrode layer 33 is formed on the top surface of the roll sheet 31. However, if as illustrated in FIG. 24(*a*), the sensor electrode layer 33 is formed on the bottom surface of the roll sheet 31, the inspection may be performed as illustrated in FIG. 24(*b*).

Moreover, if as illustrated in FIG. 25(*a*), the sensor electrode layer 32 (which includes the X-direction sensor electrodes 5*x*) is formed on the top surface of the roll sheet 31 and the sensor electrode layer 33 (which includes the Y-direction sensor electrodes 5*y*) is formed on the bottom surface of the roll sheet 31, the inspection may be performed as illustrated in FIGS. 25(*b*) and 25(*c*). In other words, when inspecting the sensor electrode layer 32, as illustrated in FIG. 25(*b*), the switch between the second inspection electrode layer 13 and the controller 3 is turned ON (and the switch between the first inspection electrode layer 12 and the controller 3 is turned OFF), and the probe Pb connected to the controller 3 is brought into contact with the terminal T2. Then, when inspecting the sensor electrode layer 33, as illustrated in FIG. 25(*c*), the switch between the first inspection electrode layer 12 and the controller 3 is turned ON (and the switch between the second inspection electrode layer 13 and the controller 3 is turned OFF), and the probe Pb connected to the controller 3 is brought into contact with the terminal T3.

Figure 26:
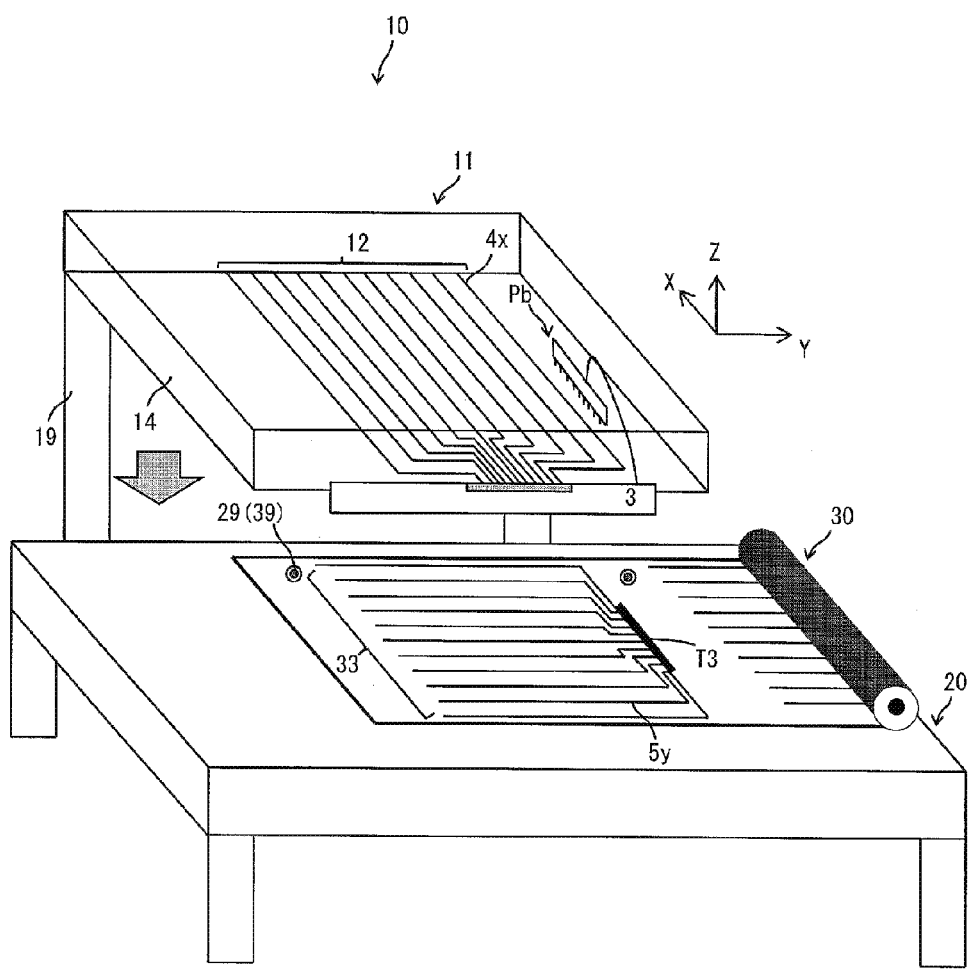
FIG. 26 is a perspective view illustrating another example of a configuration for the inspection device according to Embodiment 3.
Figure 27:
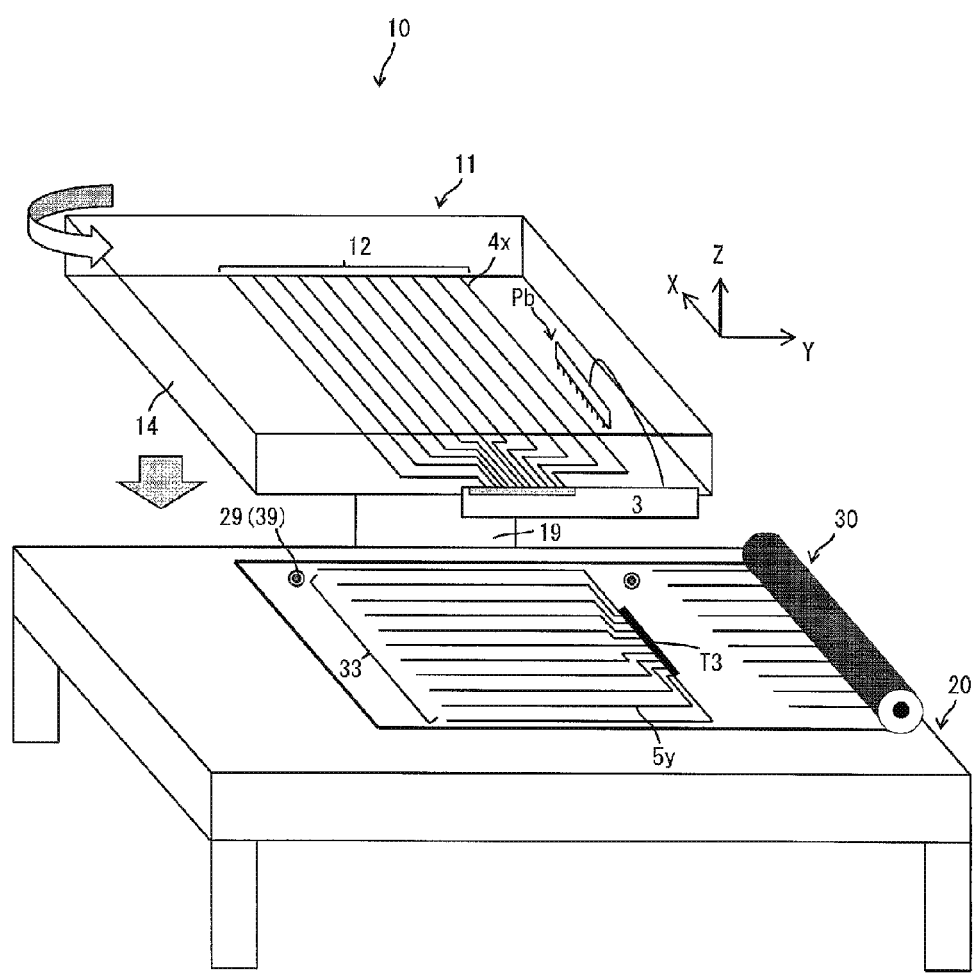
FIG. 27 is a perspective view illustrating yet another example of a configuration for the inspection device according to Embodiment 3.

In FIG. 22, the weight 11 includes the first and second inspection electrode layers 12 and 13. However, the inspection device 10 is not limited to this configuration. As illustrated in FIG. 26, the weight 11 may include only the first inspection electrode layer 12. Moreover, as illustrated in FIG. 27, when the weight 11 includes only the first inspection electrode layer 12, the weight 11 may be rotatably supported by a rotating support 19.

Figure 28:
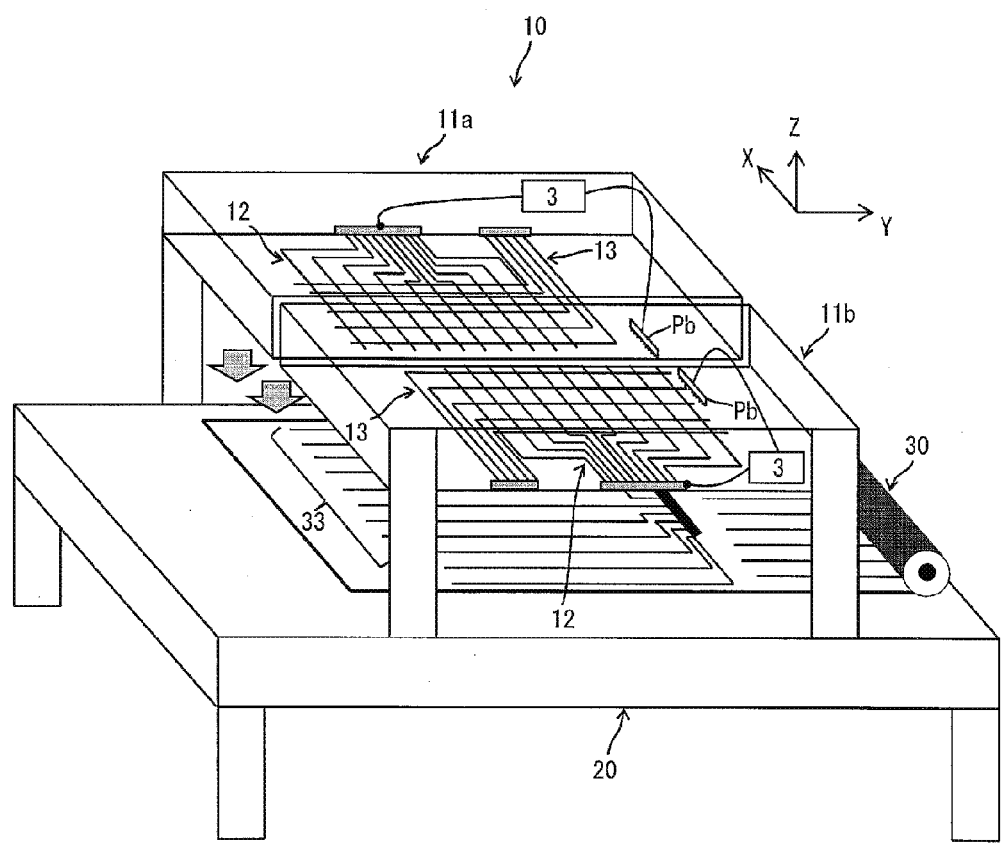
FIG. 28 is a perspective view illustrating yet another example of a configuration for the inspection device according to Embodiment 3.

Furthermore, if the sensor sheet is large, as illustrated in FIG. 28, a first weight 11*a* and a second weight 11*b* may be arranged facing one another above the inspection table 20, and the first and second weights 11*a* and 11*b* may each include first and second inspection electrode layers 12 and 13 as well as a controller 3 connected thereto.

The present invention is not limited to the embodiments described above. Any appropriate modifications of the embodiments described above made based on common technical knowledge as well as any combinations thereof are included in embodiments of the present invention.

(Summary)

The present invention provides an inspection device for inspecting a sensor electrode layer including a plurality of elongated sensor electrodes running in a direction that intersects with a first direction, including: a first inspection electrode layer including a plurality of inspection electrodes that run in the first direction; and a controller that sends drive signals to one of the first inspection electrode layer and the sensor electrode layer arranged facing the first electrode layer and that receives detection signals from an other of the first inspection electrode layer and the sensor electrode layer in order to detect a state of the sensor electrode layer.

The present inspection device may be configured such that the controller detects the state of the sensor electrode layer on the basis of a difference between sensor signals from two adjacent sensor electrodes when the controller drives the first inspection electrode layer or on the basis of a difference between sensor signals from two adjacent inspection electrodes when the controller drives the sensor electrode layer.

The present inspection device may further include: an inspection table on which an item to be inspected that includes the sensor electrode layer is arranged; and a weight that applies pressure to the item to be inspected on the inspection table, wherein the first inspection electrode layer is formed on the inspection table or in the weight.

The present inspection device may be configured such that the weight includes a bottom surface that faces the inspection table and this bottom surface is formed using a dielectric material.

The present inspection device may be configured such that the bottom surface is larger than a region of the first inspection electrode layer in which the inspection electrodes are formed.

The present inspection device may further include: a second inspection electrode layer including a plurality of inspection electrodes running in a second direction that is orthogonal to the first direction, wherein the controller can be connected to the second inspection electrode layer.

The present inspection device may be configured such that the inspection table or the weight in which the first inspection electrode layer is formed is rotatable.

In the present inspection device, an alignment mark may be formed on the inspection table.

In the present inspection device, a terminal for connecting the controller to the sensor electrode layer may be formed in the inspection table or in the weight.

INDUSTRIAL APPLICABILITY

The present invention may be applied to inspection of touch sensors.

DESCRIPTION OF REFERENCE CHARACTERS 3 controller
4*x* (X-direction) inspection electrode
5*y* (Y-direction) sensor electrode
10 inspection device
11 weight
20 inspection table
12, 22 first inspection electrode layer
13, 23 second inspection electrode layer
30 sensor sheet (item to be inspected)
32, 33 sensor electrode layer

What is claimed is:

1. A method of inspecting a sensor sheet formed by a roll-to-roll scheme for a touch sensor, the sensor sheet including a roll sheet and a sensor electrode layer on the roll sheet, the sensor electrode including a plurality of sensor electrodes running in a prescribed direction, the sensor sheet further including a terminal connected to the sensor electrode layer and alignment marks, the method comprising:
   arranging the sensor sheet on an inspection table of an inspection device, the inspection table having an alignment mark and a plurality of inspection electrodes running in another prescribed direction, the plurality of the inspection electrodes being each elongated in said another prescribed direction and are disposed side-byside with each other, the sensor sheet being arranged on the inspection table such that at least one of the alignment marks aligns with the alignment mark on the inspection table and such that the inspection electrodes of the inspection device face the sensor electrodes of the sensor electrode layer in an orthogonal fashion in a plan view and are vertically separated therefrom by a dielectric material so as to form capacitances at respective intersections between the inspection electrodes and the sensor electrodes that are arranged to be orthogonal to one another;

measuring the capacitances at the respective intersections; and outputting the measured capacitances as an inspection result.

2. The method of inspecting the sensor sheet according to claim 1, wherein the outputting of the measured capacitances includes displaying, on a display unit of the inspection device, the measured capacitances.

3. The method of inspecting the sensor sheet according to claim 1, wherein the plurality of inspection electrodes are each band-shaped and are arranged in a stripe pattern.

4. The method of inspecting the sensor sheet according to claim 1, wherein each of the plurality of inspection electrodes includes mesh-patterned electrodes connected together in said another prescribed direction.

5. The method of inspecting the sensor sheet according to claim 1, wherein the plurality of sensor electrodes are each elongated in said prescribed direction and are disposed side-by-side with each other on the roll sheet.

6. The method of inspecting the sensor sheet according to claim 5, wherein the plurality of sensor electrodes are each band-shaped and are arranged in a stripe pattern.

7. The method of inspecting the sensor sheet according to claim 5, wherein each of the plurality of sensor electrodes includes mesh-patterned electrodes connected together in said prescribed direction.

8. The method of inspecting the sensor sheet according to claim 1,
wherein the plurality of inspection electrodes are each band-shaped and are arranged in a stripe pattern, and
wherein the plurality of sensor electrodes are each band-shaped, elongated in said prescribed reaction and are arranged side-by-side in a stripe pattern.

* * * * *